US010535737B2

(12) United States Patent
Lu et al.

(10) Patent No.: US 10,535,737 B2
(45) Date of Patent: Jan. 14, 2020

(54) SEMICONDUCTOR DEVICE AND MANUFACTURING METHOD THEREOF

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Fang-Liang Lu, New Taipei (TW); Chia-Che Chung, Hsinchu (TW); Yu-Jiun Peng, Taichung (TW); Chee-Wee Liu, Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/795,519

(22) Filed: Oct. 27, 2017

(65) Prior Publication Data
US 2019/0131403 A1    May 2, 2019

(51) Int. Cl.
*H01L 27/12* (2006.01)
*H01L 29/10* (2006.01)
*H01L 29/66* (2006.01)
*H01L 29/78* (2006.01)

(52) U.S. Cl.
CPC .... *H01L 29/1054* (2013.01); *H01L 29/66545* (2013.01); *H01L 29/66795* (2013.01); *H01L 29/785* (2013.01); *H01L 29/7848* (2013.01); *H01L 29/7853* (2013.01)

(58) Field of Classification Search
USPC ............ 257/347, E27.06, E29.242, 326, 66; 356/4.01; 438/199, 401, 455
See application file for complete search history.

(56) References Cited

U.S. PATENT DOCUMENTS

| 5,578,513 | A  | 11/1996 | Maegawa |
| 7,456,476 | B2 | 11/2008 | Hareland et al. |
| 8,796,666 | B1 | 8/2014  | Huang et al. |
| 8,815,712 | B2 | 8/2014  | Wan et al. |
| 8,963,258 | B2 | 2/2015  | Yu et al. |
| 9,093,530 | B2 | 7/2015  | Huang et al. |
| 9,171,929 | B2 | 10/2015 | Lee et al. |

(Continued)

OTHER PUBLICATIONS

M.J.H. van Dal et. al., "Highly manufacturable FinFETs with sub-10nm fin width and high aspect ratio fabricated with immersion lithography", Symposium on VLSI Technology Digest of Technical Papers, 7A-3, 2007.

(Continued)

*Primary Examiner* — Niki H Nguyen
(74) *Attorney, Agent, or Firm* — McClure, Qualey & Rodack, LLP

(57) ABSTRACT

A semiconductor device includes a substrate, a channel structure, and a gate structure. The channel structure is over the substrate and extends along a first direction, in which the channel structure has plurality of first portions and plurality of second portions alternately stacked, and a width of the first portions is smaller than that of the second portions in a second direction different from the first direction. The gate structure is disposed over the substrate and crossing the channel structure along the second direction, in which the gate structure is in contact with the first portions and the second portions.

20 Claims, 29 Drawing Sheets

(56) References Cited

U.S. PATENT DOCUMENTS

| | | | |
|---|---|---|---|
| 9,214,555 | B2 | 12/2015 | Oxland et al. |
| 9,236,267 | B2 | 1/2016 | De et al. |
| 9,490,323 | B2 | 11/2016 | Rodder et al. |
| 9,520,482 | B1 | 12/2016 | Chang et al. |
| 9,548,303 | B2 | 1/2017 | Lee et al. |
| 9,576,814 | B2 | 2/2017 | Wu et al. |
| 9,923,055 | B1* | 3/2018 | Cheng .................. H01L 29/0665 |
| 9,947,804 | B1* | 4/2018 | Frougier ............ H01L 29/78696 |
| 2014/0353574 | A1* | 12/2014 | Li ........................ H01L 29/0673 257/9 |
| 2018/0006139 | A1* | 1/2018 | Seo ................... H01L 29/66795 |

OTHER PUBLICATIONS

Min-Cheng Chen et. al., "A 10 nm Si-based Bulk FinFETs 6T SRAM with Multiple Fin Heights Technology for 25% Better Static Noise Margin", Symposium on VLSI Technology Digest of Technical Papers, JJ2-7, 2013.

Takashi Matsukawa et. al., "Decomposition of On-Current Variability of nMOS FinFETs for Prediction Beyond 20 nm", IEEE Transactions on Electron Devices, vol. 59, No. 8, pp. 2003, Aug. 2012.

Tetsuro Hayashida et. al., "Fin-Height Effect on Poly-Si/PVD-TiN Stacked-Gate FinFET Performance", IEEE Transactions on Electron Devices, vol. 59, No. 3, pp. 647, Mar. 2012.

A. Veloso et. al., "Highly Scalable Effective Work Function Engineering Approach for Multi-VT Modulation of Planar and FinFET-based RMG High-k Last Devices for (Sub-)22nm Nodes", Symposium on VLSI Technology Digest of Technical Papers, T14-1, 2013.

Chih-Chao Yang et. al., "Footprint-efficient and power-saving monolithic IoT 3D+ IC constructed by BEOL-compatible sub-10nm high aspect ratio (Ar>7) single-grained Si FinFETs with record high Ion of 0.38 mA/μm and steep-swing of 65 mV/dec. and Ion/Ioff ratio of 8", IEDM, 9.1.1, 2016 IEEE.

S. Borel et. al., "Isotropic etching of SiGe alloys with high selectivity to similar materials", Microelectronic Engineering vols. 73-74, (2004), 301-305.

* cited by examiner

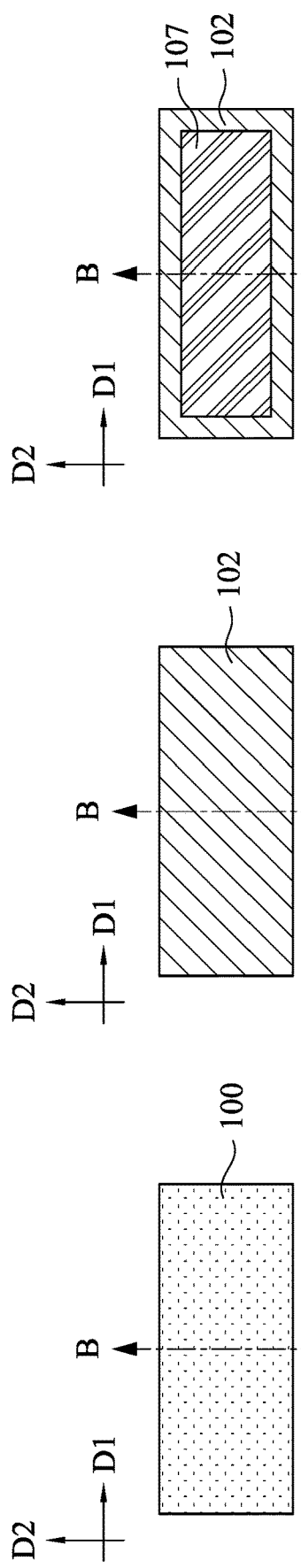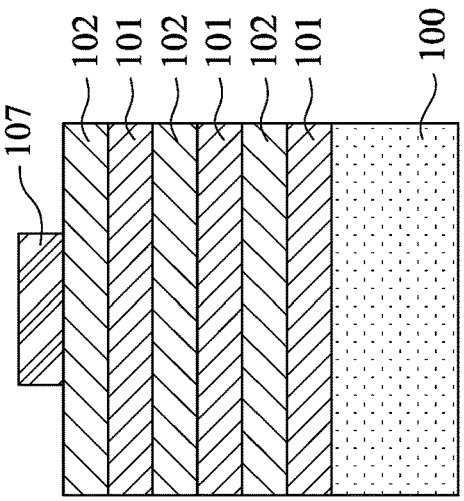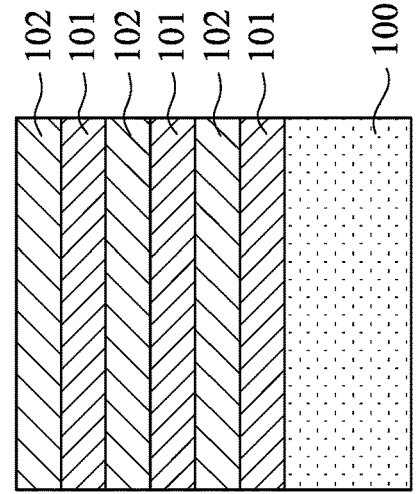

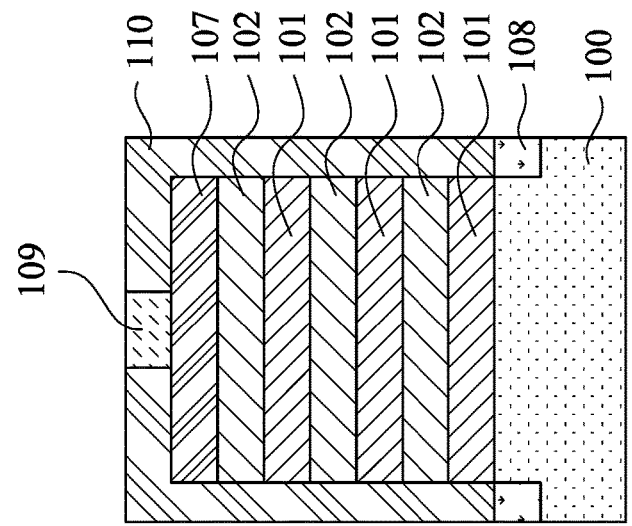
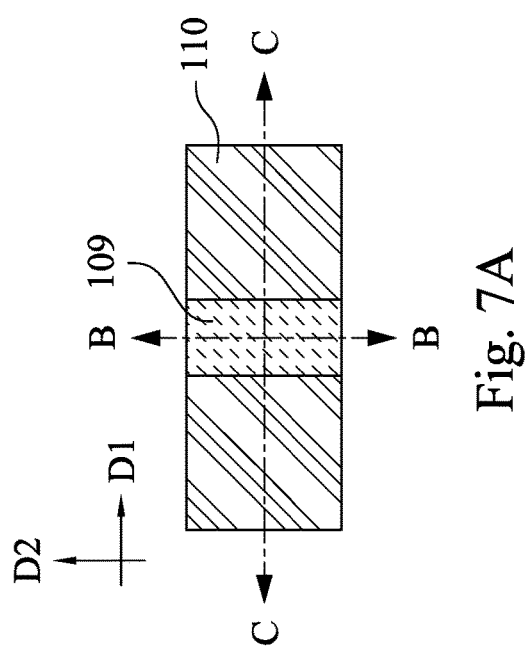
Fig. 7A
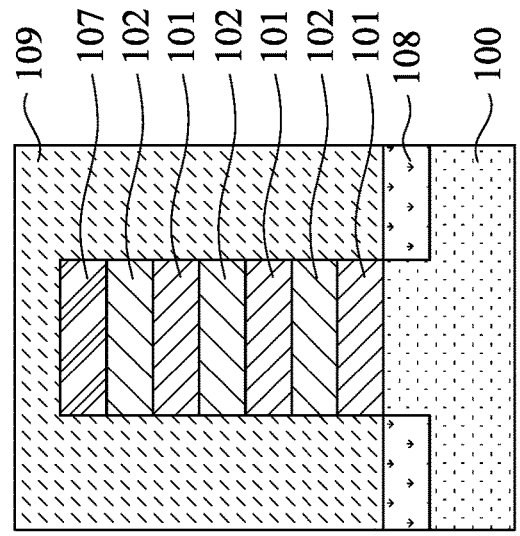
Fig. 7B
Fig. 7C

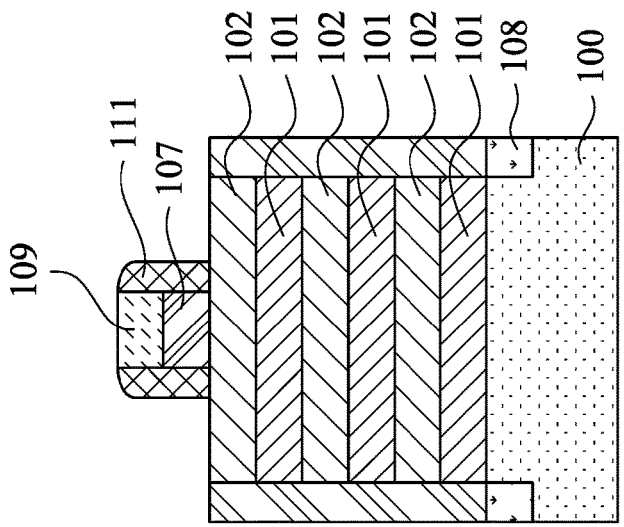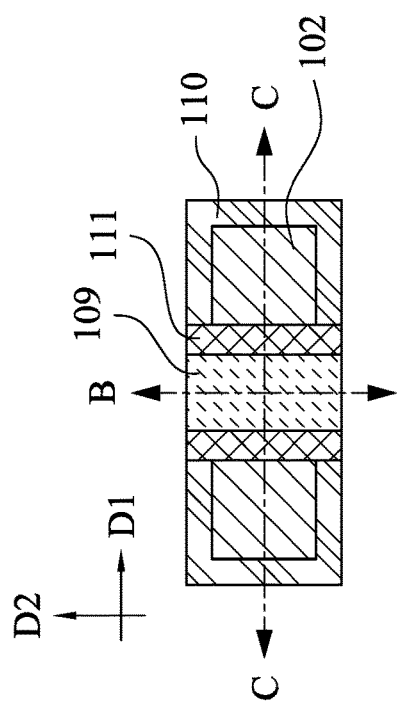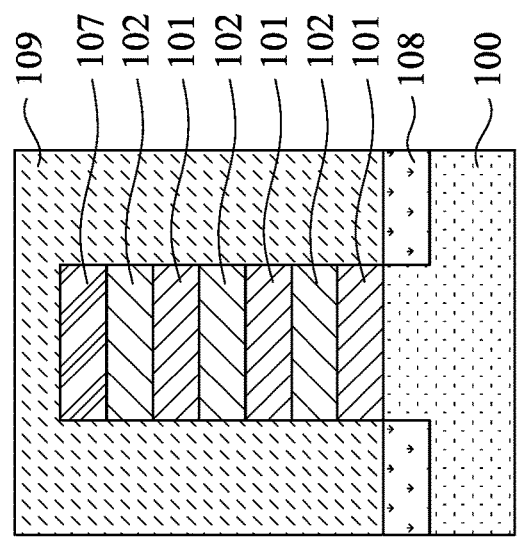
Fig. 10A
Fig. 10B
Fig. 10C

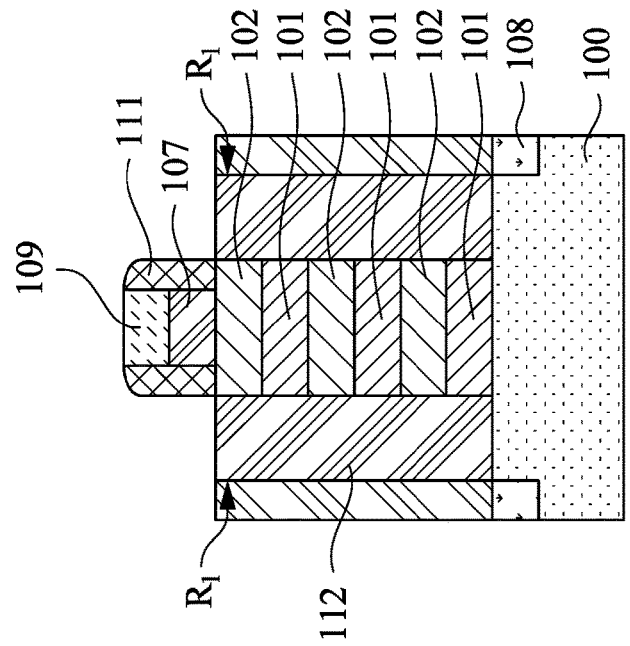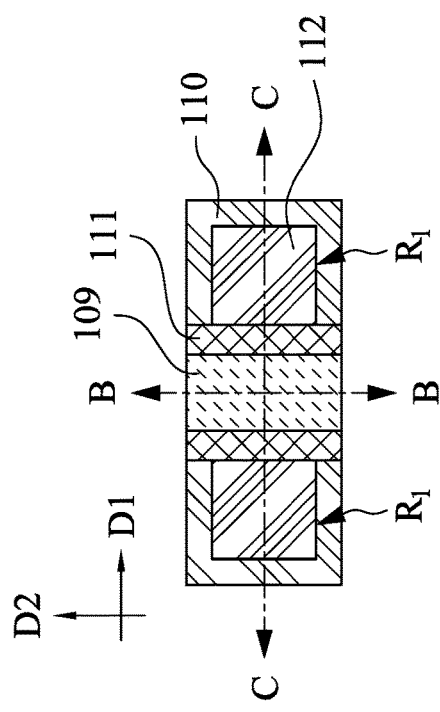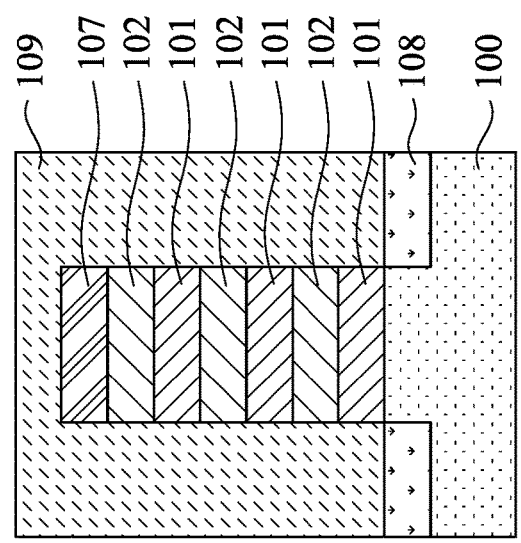
Fig. 11A
Fig. 11B
Fig. 11C

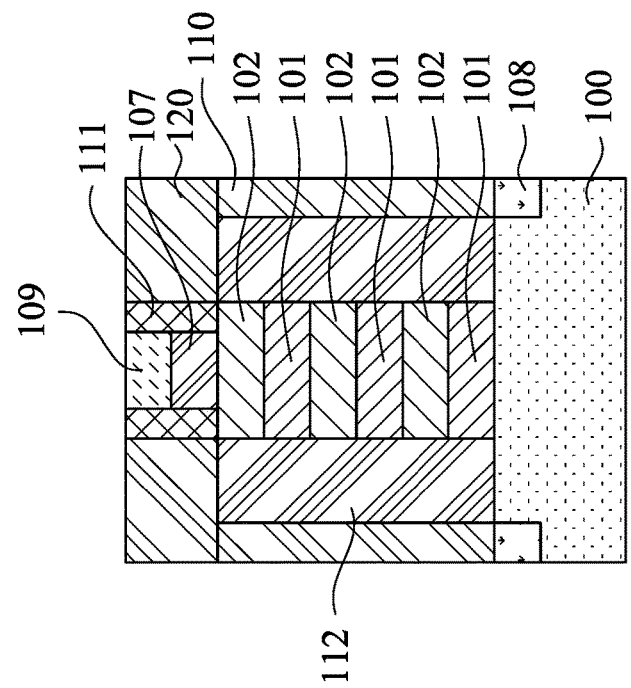
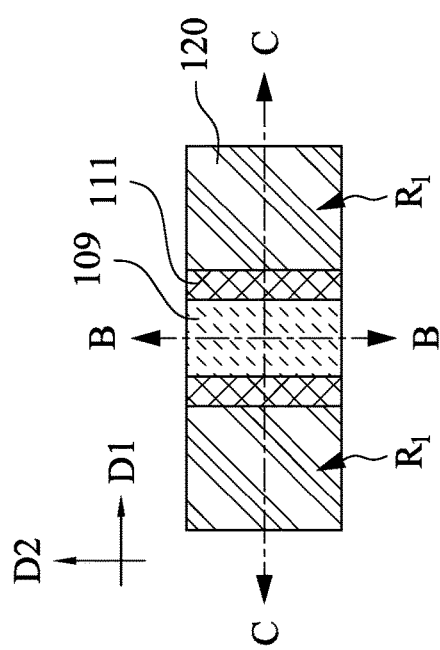
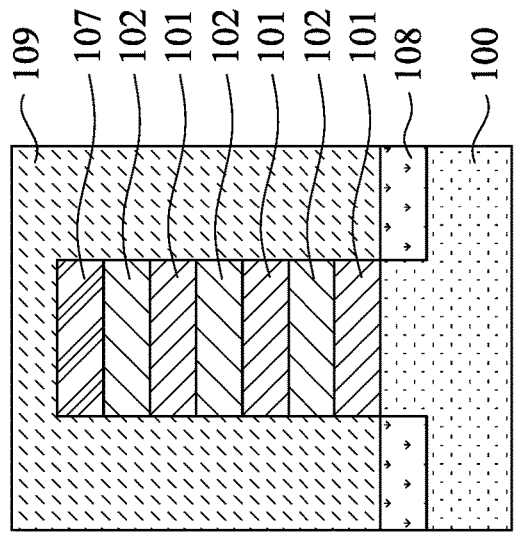
Fig. 12A
Fig. 12B
Fig. 12C

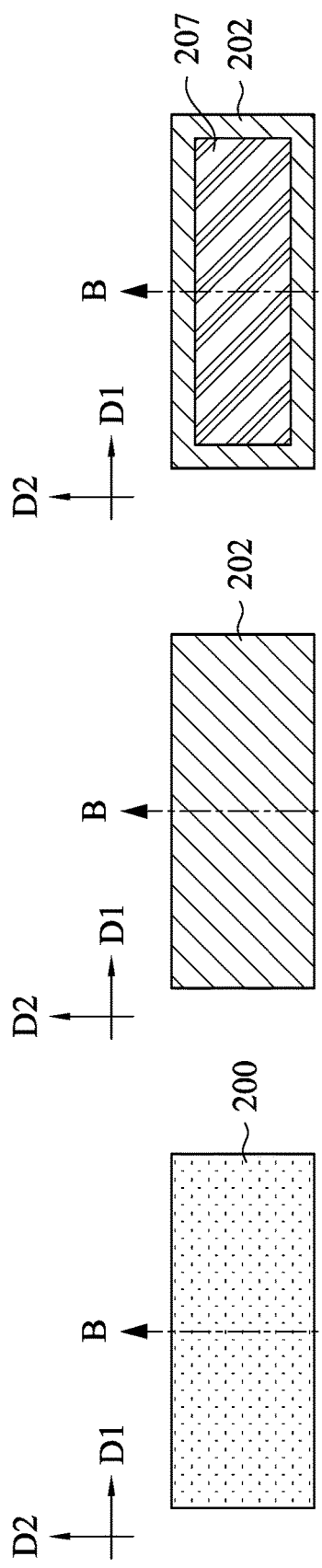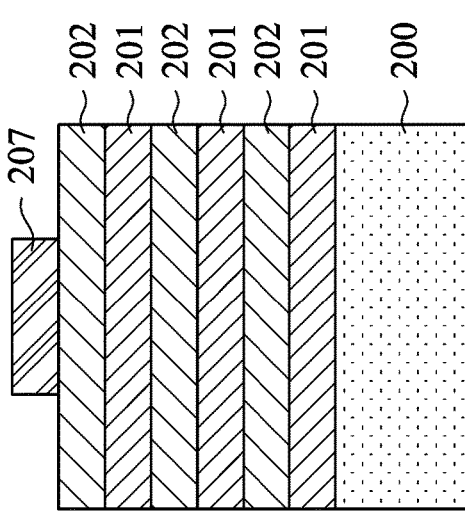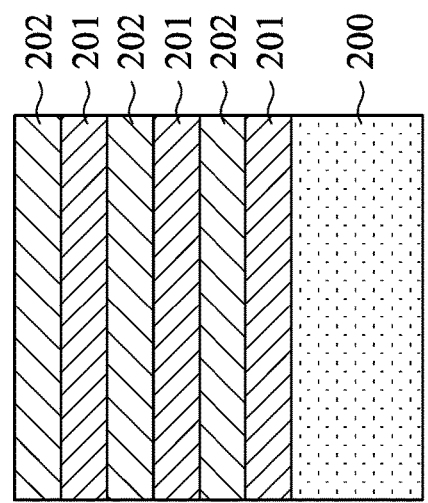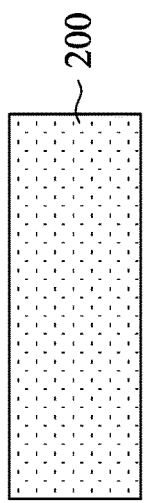

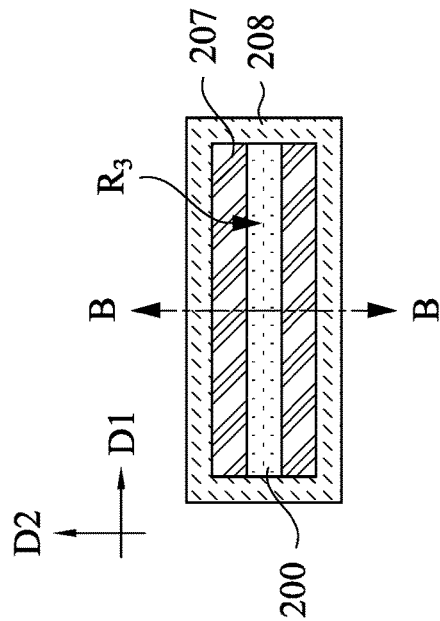
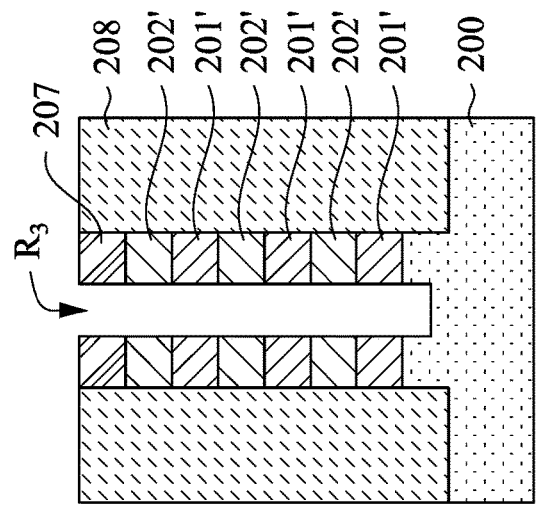
Fig. 23A
Fig. 23B
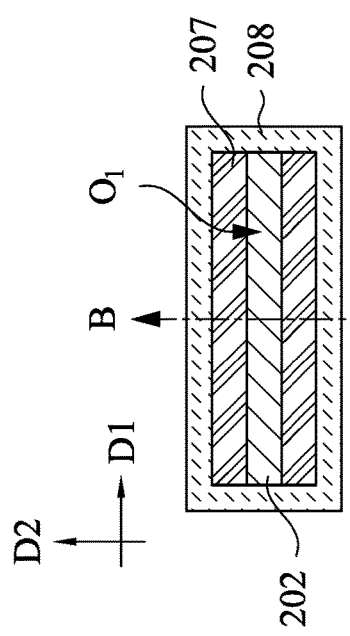
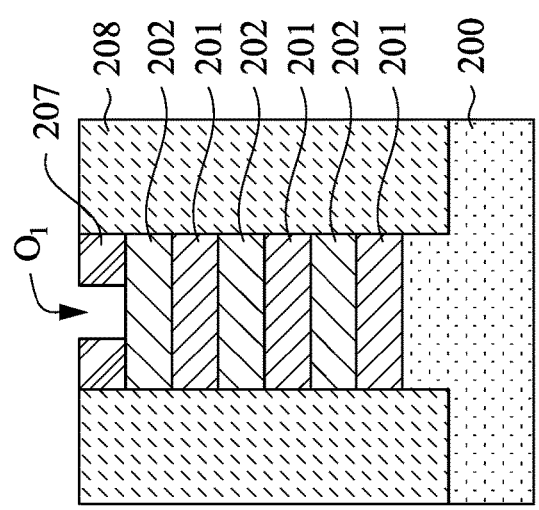
Fig. 24A
Fig. 24B

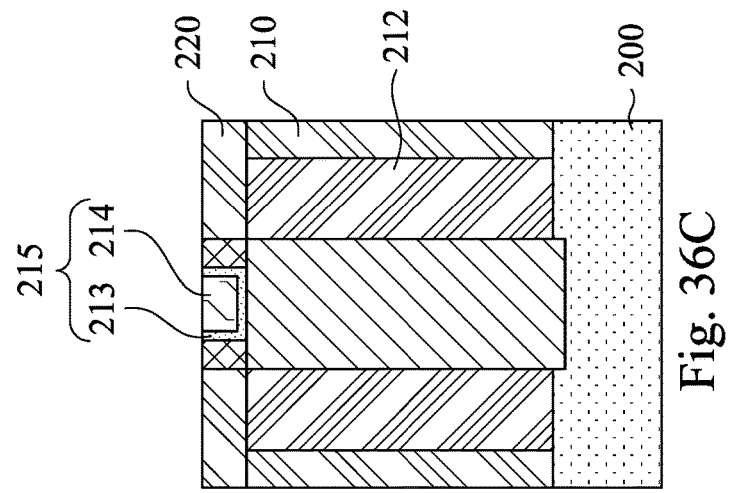
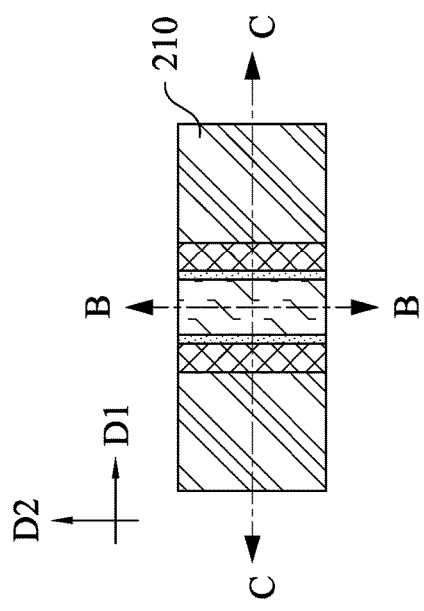
Fig. 36A
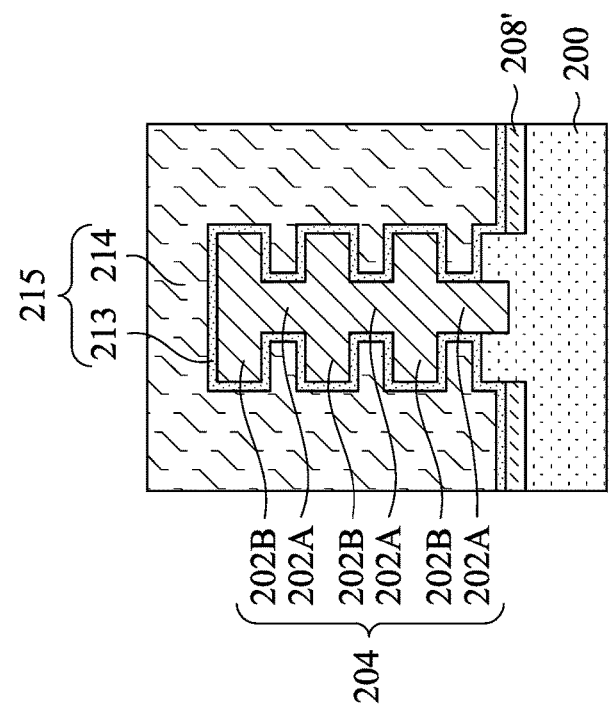
Fig. 36B
Fig. 36C

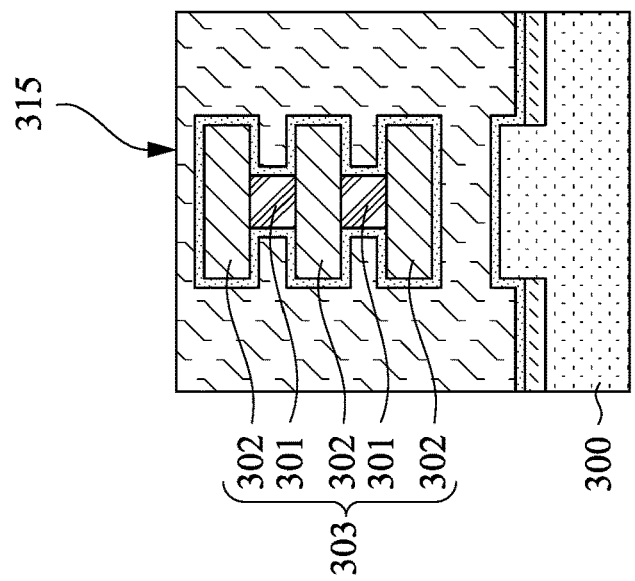
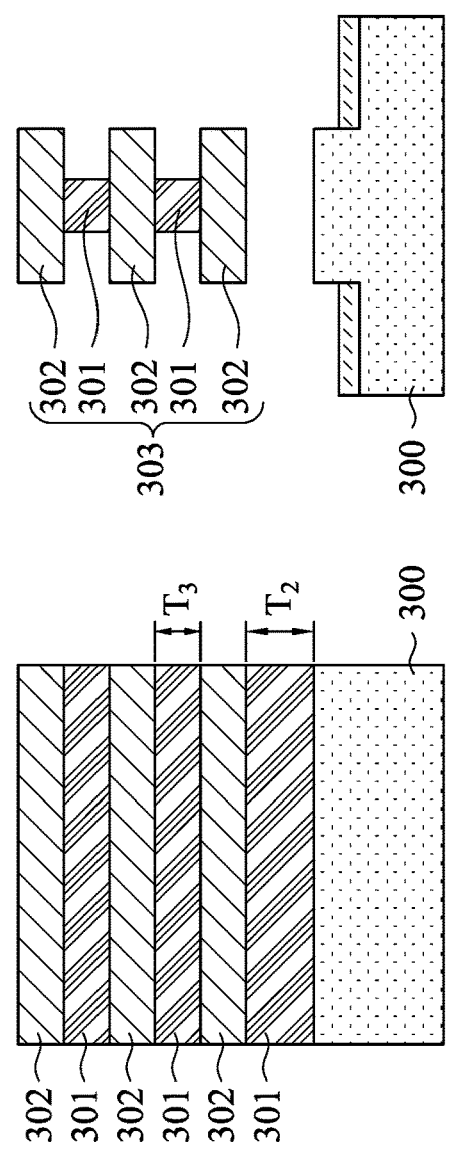
Fig. 37C
Fig. 37B
Fig. 37A

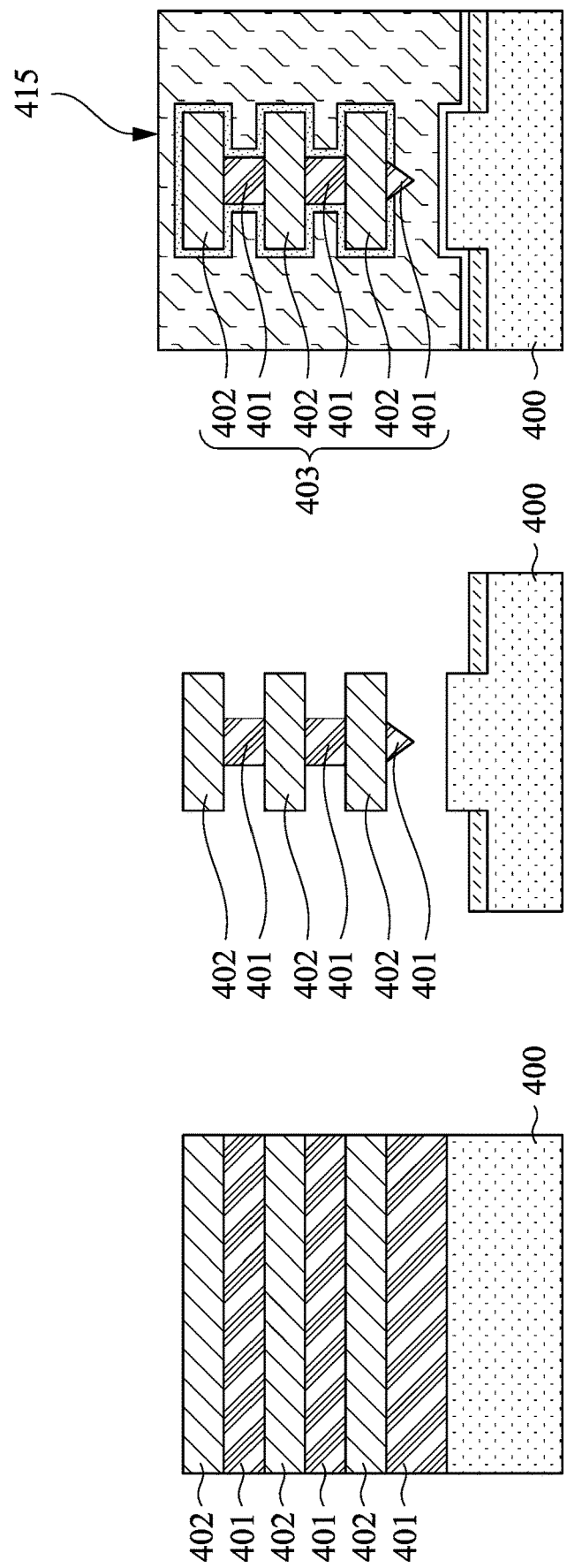

SEMICONDUCTOR DEVICE AND MANUFACTURING METHOD THEREOF

BACKGROUND

The semiconductor integrated circuit (IC) industry has experienced rapid growth. In the course of IC evolution, functional density (i.e., the number of interconnected devices per chip area) has increased while geometry size (i.e., the smallest component (or line) that can be created using a fabrication process) has decreased. This scaling down process increases production efficiency and lowers associated costs.

Such scaling down has also increased the complexity of processing and manufacturing ICs and, for these advances to be realized, similar developments in IC processing and manufacturing are desired. For example, a three dimensional transistor, such as a fin-like field-effect transistor (FinFET), has been introduced to replace a planar transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 17C illustrate a method of manufacturing a semiconductor device at various stages in accordance with some embodiments.

FIGS. 18A to 36C illustrate a method of manufacturing a semiconductor device at various stages in accordance with some embodiments.

FIGS. 37A to 37C illustrate a method of manufacturing a semiconductor device at various stages in accordance with some embodiments.

FIGS. 38A to 38C illustrate a method of manufacturing a semiconductor device at various stages in accordance with some embodiments.

DETAILED DESCRIPTION

Figure 4A:
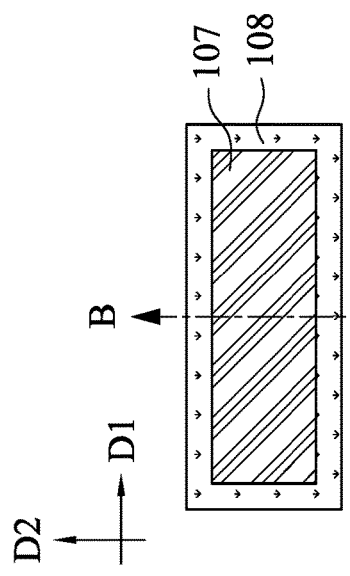

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A to 17C illustrate a method of manufacturing a semiconductor device at various stages in accordance with some embodiments.

Reference is made to FIGS. 1A and 1B, in which FIG. 1A is a top view of one stage of manufacturing a semiconductor device, and FIG. 1B is a cross-sectional view along line B-B of FIG. 1A. A substrate 100 is provided. The substrate 100 may be a bulk silicon substrate. Alternatively, the substrate 100 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 100 also include a silicon-on-insulator (SOI) substrate. SOI substrates are fabricated using separation by implantation of oxygen (SIMOX), wafer bonding, and/or other suitable methods.

The substrate 100 may also include various doped regions. The doped regions may be doped with p-type dopants, such as boron or $BF_2$; n-type dopants, such as phosphorus or arsenic; or combinations thereof. The doped regions may be formed directly on the substrate 100, in a P-well structure, in an N-well structure, in a dual-well structure, and/or using a raised structure. The substrate 100 may further include various active regions, such as regions configured for an N-type metal-oxide-semiconductor transistor device and regions configured for a P-type metal-oxide-semiconductor transistor device.

Reference is made to FIGS. 2A and 2B, in which FIG. 2A is a top view of one stage of manufacturing a semiconductor device, and FIG. 2B is a cross-sectional view along line B-B of FIG. 2A. A plurality of first semiconductor layers 101 and second semiconductor layers 102 are formed over the substrate 100, in which the first semiconductor layers 101 and second semiconductor layers 102 are alternately formed such that the first semiconductor layers 101 and second semiconductor layers 102 are alternately stacked on each other. It is understood that the numbers of layers of the first semiconductor layers 101 and second semiconductor layers 102 are merely used to explained, and the present disclosure is not limited thereto.

The first semiconductor layers 101 and the second semiconductor layers 102 may be formed by chemical vapor deposition (CVD), molecular beam epitaxy (MBE), or other suitable process(es). In some embodiments, the first semiconductor layers 101 are formed in a temperature higher than about 750° C., and the thickness of the first semiconductor layers 101 is in a range of about 5 nm to about 13.5 nm. In some other embodiments, the first semiconductor layers 101 is formed in a temperature lower than about 650° C., and the thickness of the first semiconductor layers 101 is in a range of about 3 nm to about 16.5 nm.

The first semiconductor layers 101 and the second semiconductor layers 102 have different materials and/or components, such that the first semiconductor layers 101 and the second semiconductor layers 102 have different etching rates. In some embodiments, the first semiconductor layers 101 are made from SiGe. The germanium percentage (atomic percentage) of the first semiconductor layers 101 is in the range between about 10 percent and about 20 percent, while higher or lower germanium percentages may be used. It is appreciated, however, that the values recited throughout the description are examples, and may be changed to different values. For example, the first semiconductor layers 101 may be $Si_{0.8}Ge_{0.2}$ or $Si_{0.9}Ge_{0.1}$, the proportion between Si and Ge may vary from embodiments, and the disclosure is not limited thereto. The second semiconductor layers 102 may be pure silicon layers that are free from germanium. The second semiconductor layers 102 may also be substantially pure silicon layers, for example, with a germanium percentage lower than about 1 percent. In some other embodiments, the second semiconductor layers 102 and the substrate 100 may be made from the same material or different materials. In some embodiments, the first semiconductor layers 101 may be doped for tuning the threshold voltage (Vt), and the Vt of the first semiconductor layers 101 is close to the Vt of second semiconductor layers 102 while increasing the dopant concentration of the first semiconductor layers 101.

Reference is made to FIGS. 3A and 3B, in which FIG. 3A is a top view of one stage of manufacturing a semiconductor device, and FIG. 3B is a cross-sectional view along line B-B of FIG. 3A. A patterned mask 107 is formed over the first semiconductor layers 101 and the second semiconductor layers 102 to define a fin region in the following process. In some embodiments, the patterned mask 107 is in contact with one of the second semiconductor layers 102. The patterned mask 107 may be formed from, for example, $Si_3N_4$ or other suitable materials.

Figure 4B:
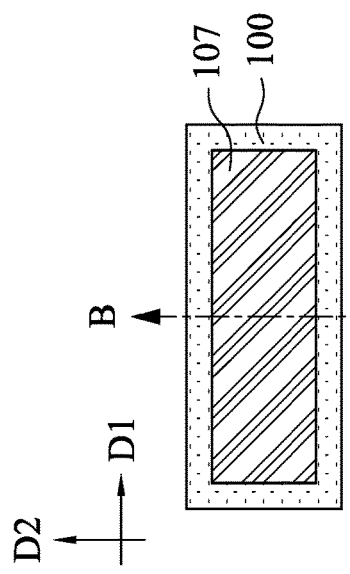

Reference is made to FIGS. 4A and 4B, in which FIG. 4A is a top view of one stage of manufacturing a semiconductor device, and FIG. 4B is a cross-sectional view along line B-B of FIG. 4A. The substrate 100, the first semiconductor layers 101, and the second semiconductor layers 102 are patterned with the mask 107. After the patterning, the patterned substrate 100 includes a protrusion portion 1001, and the patterned first semiconductor layers 101 and the patterned second semiconductor layers 102 are disposed over the protrusion portion 1001, in which the bottommost layer of the patterned first semiconductor layers 101 is in contact with the protrusion portion 1001. In some embodiments, the protrusion portion 1001, the patterned first semiconductor layers 101, and the patterned second semiconductor layers 102 have substantially the same width. The patterned first semiconductor layers 101 and the patterned second semiconductor layers 102 extend along a direction D1.

The patterning may be performed using suitable process, such as etching. In some embodiments, the etching includes anisotropic etching, such as dry etching. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching). In some embodiments, the power of the dry etching process is about 150 Watt.

Figure 5A:
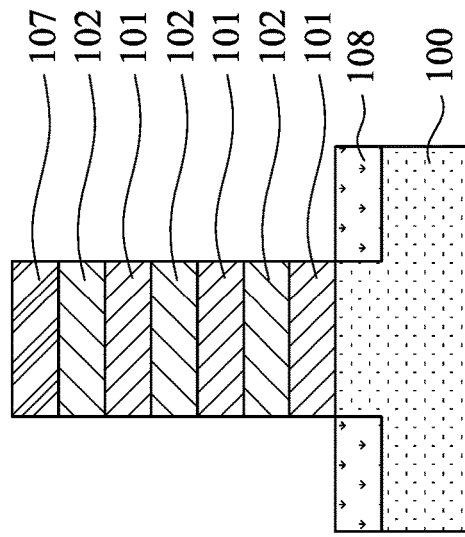
Figure 5B:
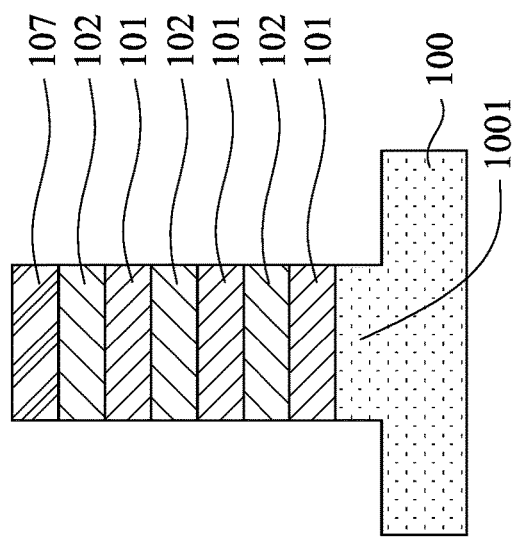

Reference is made to FIGS. 5A and 5B, in which FIG. 5A is a top view of one stage of manufacturing a semiconductor device, and FIG. 5B is a cross-sectional view along line B-B of FIG. 5A. An isolation structure 108 is formed over the substrate 100 and adjacent to the protrusion portion 1001 of the substrate 100. The isolation structure 108, which acts as a shallow trench isolation (STI) around the first and the second semiconductor layers 101 and 102 may be formed by performing a chemical vapor deposition (CVD), such as high density plasma CVD (HDPCVD), to form a dielectric material. Following a chemical mechanical polish (CMP) process is performed to level the top surface of the dielectric material with the top surface of the mask 107, and the dielectric material is etched back to form the isolation structure 108. In yet some other embodiments, the isolation structure 108 is an insulator layer of a SOI wafer.

Figure 6C:
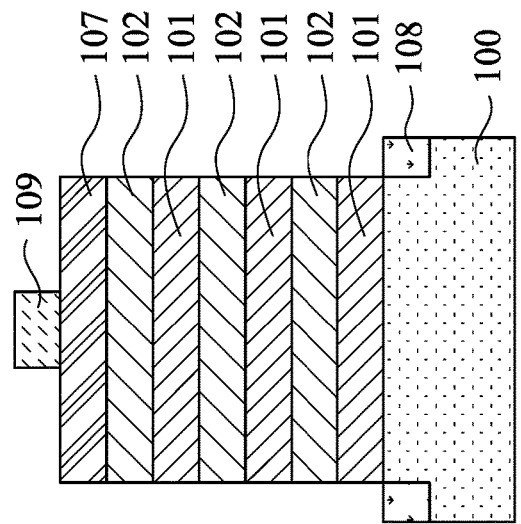
Figure 6A:
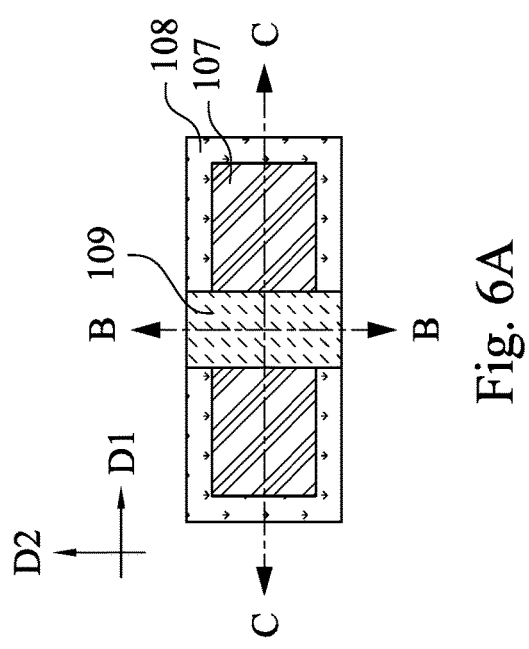
Figure 6B:
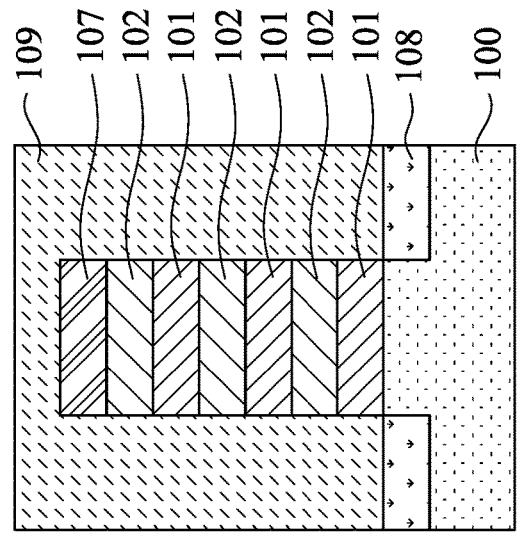

Reference is made to FIGS. 6A to 6C, in which FIG. 6A is a top view of one stage of manufacturing a semiconductor device, FIG. 6B is a cross-sectional view along line B-B of FIG. 6A, and FIG. 6C is a cross-sectional view along line C-C of FIG. 6A. A dummy gate structure 109 is formed over the substrate 100 and crossing the first semiconductor layers 101 and the second semiconductor layers 102 along a direction D2, in which the direction D2 is different from the direction D1. For example, the direction D2 is substantially vertical to the direction D1.

In some embodiments, the dummy gate structure 109 includes a dummy gate electrode and a gate dielectric underlying the dummy gate electrode. The dummy gate electrode may include polycrystalline-silicon (poly-Si) or poly-crystalline silicon-germanium (poly-SiGe). Further, the dummy gate electrode may be doped poly-silicon with uniform or non-uniform doping. The gate dielectric may include, for example, silicon dioxide, silicon nitride, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In various examples, the gate dielectric may be deposited by an ALD process, a CVD process, a subatmospheric CVD (SACVD) process, a flowable CVD process, a PVD process, or other suitable process. By way of example, the gate dielectric may be used to prevent damage to the first semiconductor layers 101 and the second semiconductor layers 102 by subsequent processing (e.g., subsequent formation of the dummy gate electrode).

Reference is made to FIGS. 7A to 7C, in which FIG. 7A is a top view of one stage of manufacturing a semiconductor device, FIG. 7B is a cross-sectional view along line B-B of FIG. 7A, and FIG. 7C is a cross-sectional view along line C-C of FIG. 7A. An isolation material 110 is formed over the substrate 100. The isolation material 110 may be formed by suitable process, such as CVD or PVD. Further, a planarization process, such as chemical mechanical polishing (CMP), may be performed to the isolation material 110 until the dummy gate structure 109 is exposed, such that top surfaces of the isolation material 110 and the dummy gate structure 109 are substantially coplanar. In some embodiments, the isolation material 110 may be SiOC, or other suitable materials.

Figure 8A:
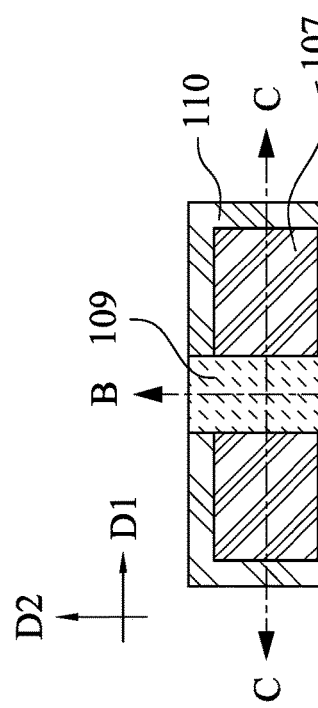
Figure 8B:
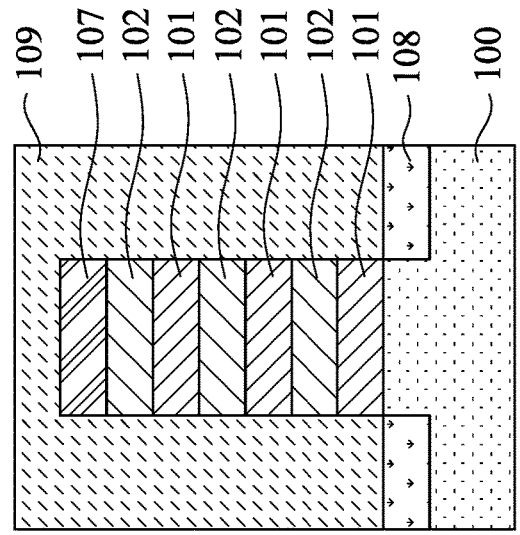
Figure 8C:
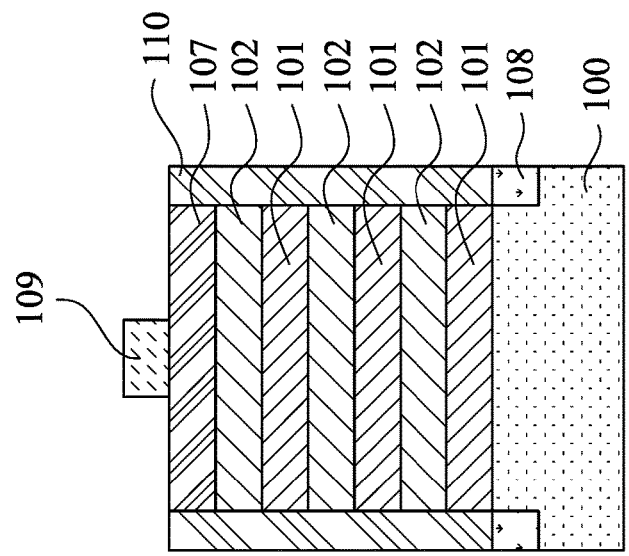

Reference is made to FIGS. 8A to 8C, in which FIG. 8A is a top view of one stage of manufacturing a semiconductor device, FIG. 8B is a cross-sectional view along line B-B of FIG. 8A, and FIG. 8C is a cross-sectional view along line C-C of FIG. 8A. The isolation material 110 is partially removed by, for example, dry etching. Accordingly, the mask 107 is exposed from the isolation material 110 and the dummy gate structure 109. In some embodiments, the top surface of the remained isolation material 110 is substantially level with the top surface of the mask 107.

Figure 9C:
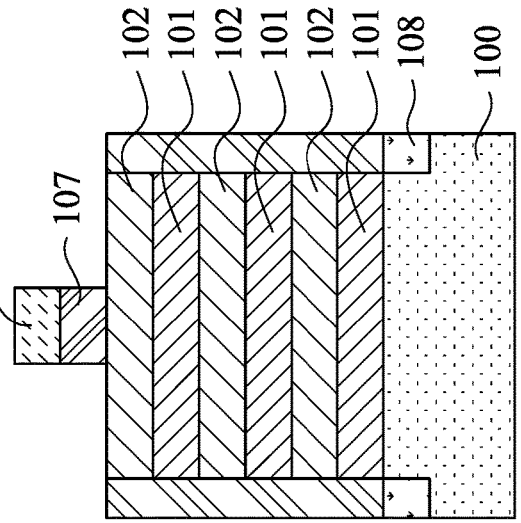
Figure 9A:
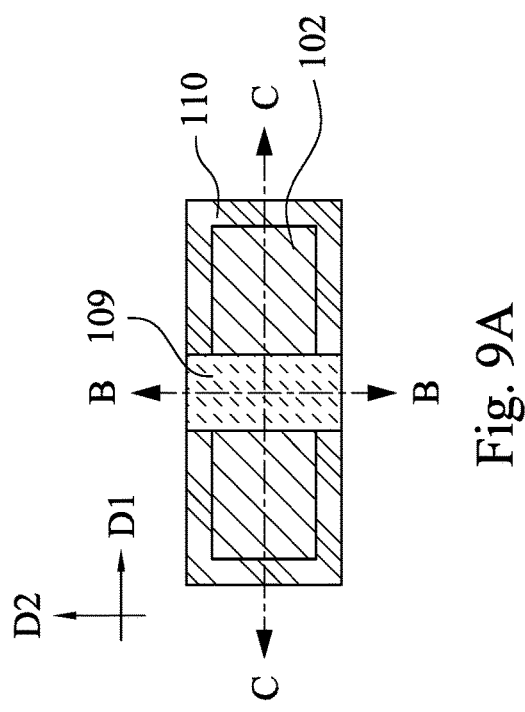
Figure 9B:
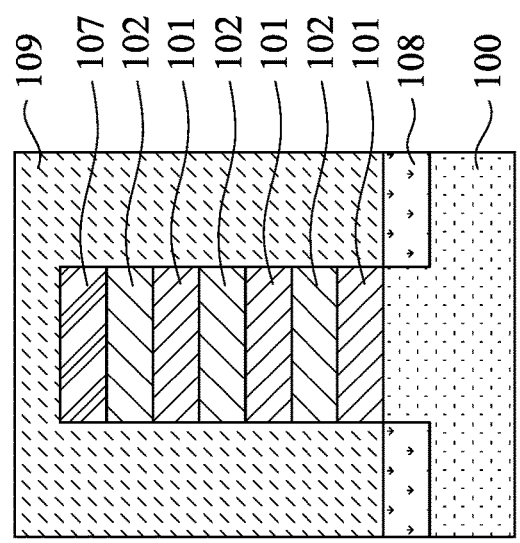

Reference is made to FIGS. 9A to 9C, in which FIG. 9A is a top view of one stage of manufacturing a semiconductor device, FIG. 9B is a cross-sectional view along line B-B of FIG. 9A, and FIG. 9C is a cross-sectional view along line C-C of FIG. 9A. The mask 107 is patterned using the dummy gate structure 109 as a mask. After the mask 107 is patterned, the topmost second semiconductor layer 102 is exposed from the isolation material 110 and the dummy gate structure 109. The mask 107 may be patterned by, for example, dry etching. In some embodiments, the etchants may be $CHF_3$ and Ar. The isolation material 110 may also be patterned during patterning the mask 107. In other words, the mask 107 and the isolation material 110 may be patterned at the same time.

Reference is made to FIGS. 10A to 10C, in which FIG. 10A is a top view of one stage of manufacturing a semiconductor device, FIG. 10B is a cross-sectional view along line B-B of FIG. 10A, and FIG. 10C is a cross-sectional view along line C-C of FIG. 10A. Plural gate spacers 111 are formed on opposite sidewalls of the dummy gate structure 109 and the mask 107. In some embodiments, the gate spacers 111 include single or multiple layers. The gate spacers 111 can be formed by blanket depositing one or more dielectric layer(s) (not shown) on the previously formed structure. The dielectric layer(s) may include silicon nitride (SiN), oxynitride, silicon carbon (SiC), silicon oxynitride (SiON), oxide, and the like. The gate spacers 111 may be formed by methods such as CVD, plasma enhanced CVD, sputter, or the like. The gate spacers 111 may then be patterned, such as by one or more etch processes to remove horizontal portions of the gate spacers 111 from the horizontal surfaces of the structure.

Reference is made to FIGS. 11A to 11C, in which FIG. 11A is a top view of one stage of manufacturing a semiconductor device, FIG. 11B is a cross-sectional view along line B-B of FIG. 11A, and FIG. 11C is a cross-sectional view along line C-C of FIG. 11A. The first semiconductor layers 101 and the second semiconductor layers 102 are patterned using the dummy gate structure 109 and the gate spacers 111 as a mask. The first semiconductor layers 101 and the second semiconductor layers 102 may be patterned by suitable process, such as etching. After the patterning, recesses $R_1$ are formed over the substrate 100, in which one of the recesses $R_1$ is defined by the isolation material 110 and the semiconductor layers 101 and 102. Then, plural source/drain structures 112 are formed in the recesses $R_1$, respectively. Accordingly, the source/drain structures 112 are in contact with the isolation material 110, and the semiconductor layers 101 and 102.

In some embodiments, the source/drain structures 112 may be epitaxy structures, and may also be referred to as epitaxy structures 112. The source/drain structures 112 may be formed using one or more epitaxy or epitaxial (epi) processes, such that Si features, SiGe features, and/or other suitable features can be formed in a crystalline state on the substrate 100. In some embodiments, lattice constants of the source/drain structures 112 are different from lattice constants of the semiconductor layers 101 and 102, such that the semiconductor layers 101 and 102 are strained or stressed to enable carrier mobility of the semiconductor device and enhance the device performance. In some embodiments, the source/drain structures 112 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the substrate 100 (e.g., silicon). The source/drain structures 112 may be in-situ doped. The doping species include P-type dopants, such as boron or $BF_2$; N-type dopants, such as phosphorus or arsenic; and/or other suitable dopants including combinations thereof. If the source/drain structures 112 are not in-situ doped, a second implantation process (i.e., a junction implant process) is performed to dope the source/drain structures 112. One or more annealing processes may be performed to activate the source/drain structures 112. The annealing processes include rapid thermal annealing (RTA) and/or laser annealing processes.

Reference is made to FIGS. 12A to 12C, in which FIG. 12A is a top view of one stage of manufacturing a semiconductor device, FIG. 12B is a cross-sectional view along line B-B of FIG. 12A, and FIG. 12C is a cross-sectional view along line C-C of FIG. 12A. An isolation material 120 is formed over the substrate 100. In some embodiments, the material of the isolation material 120 is the same as the isolation material 110. Further, a planarization process, such as chemical mechanical polishing (CVD), may be performed to the isolation material 120 until the dummy gate structure 109 is exposed, such that top surfaces of the isolation material 120, the dummy gate structure 109, and the gate spacers 111 are substantially coplanar.

Figure 13A:
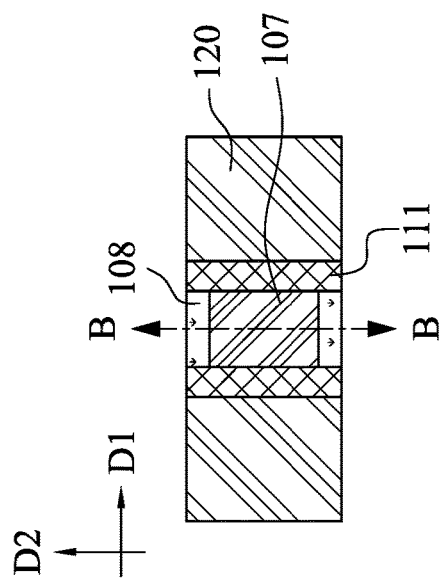
Figure 13B:
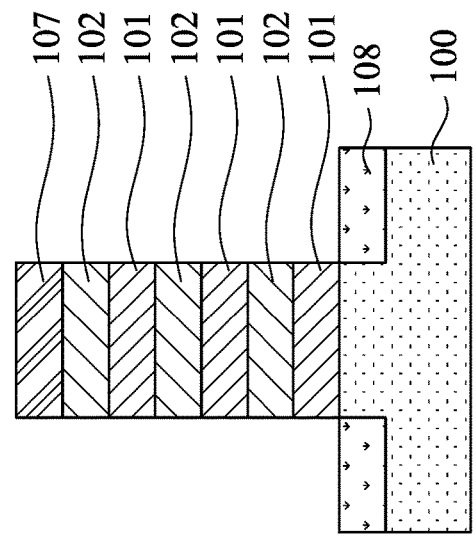

Reference is made to FIGS. 13A and 13B, in which FIG. 13A is a top view of one stage of manufacturing a semiconductor device, and FIG. 13B is a cross-sectional view along line B-B of FIG. 13A. In some embodiments, a replacement gate (RPG) process scheme is employed. In a RPG process scheme, a dummy polysilicon gate (the dummy gate electrode in this case) is formed first and is replaced later by a metal gate after high thermal budget processes are performed. In some embodiments, the dummy gate electrode is removed to form an opening with the spacers 111 as its sidewall. In some other embodiments, the gate dielectric is removed as well. Alternatively, in some embodiments, the dummy gate electrode is removed while the gate dielectric retains. The dummy gate electrode (and the gate dielectric) may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 14A:
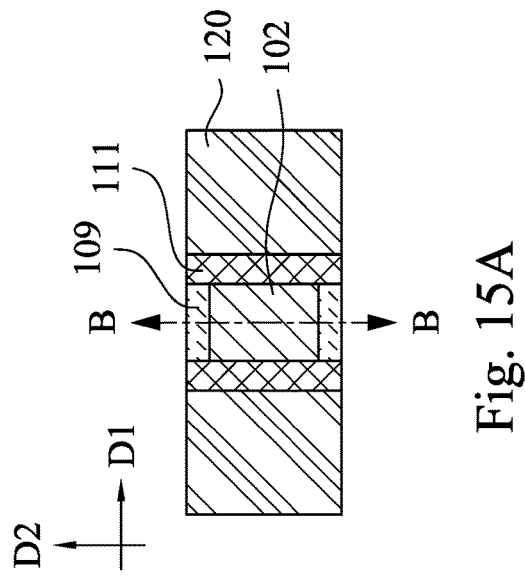
Figure 14B:
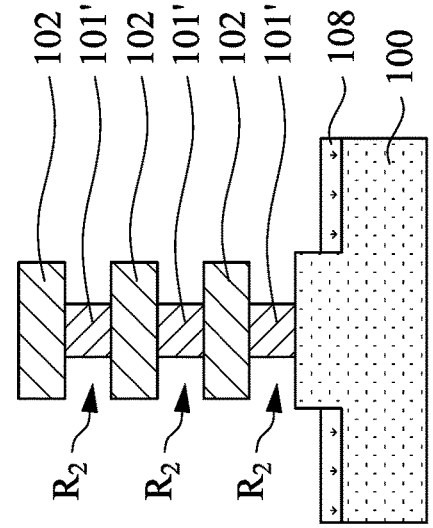

Reference is made to FIGS. 14A and 14B, in which FIG. 14A is a top view of one stage of manufacturing a semiconductor device, and FIG. 14B is a cross-sectional view along line B-B of FIG. 14A. The first semiconductor layers 101 (shown in FIG. 13B) are partially removed by suitable process, such as isotropic etching by using $CF_4$ as etchants. In some embodiments, the etching process may include etching selectivity, such that the second semiconductor layers 102 remain the same during the etching process. The remained first semiconductor layers 101 are labeled as 101' in the following descriptions. After the etching process, a plurality of recesses $R_2$ are formed between two adjacent second semiconductor layers 102, in which a bottommost recess $R_2$ is formed between one second semiconductor layer 102 and the substrate 100. From other perspectives, some of the recesses $R_2$ are defined by two second semiconductor layers 102 and the first semiconductor layer 101' therebetween. In some embodiments, the etching rate may be controlled (or tuned) such that the first semiconductor layers 101' are kept between and in contact with two adjacent second semiconductor layers 102, and the bottommost first semiconductor layer 101' is kept between and in contact with one second semiconductor layer 102 and the substrate 100.

Figure 15A:
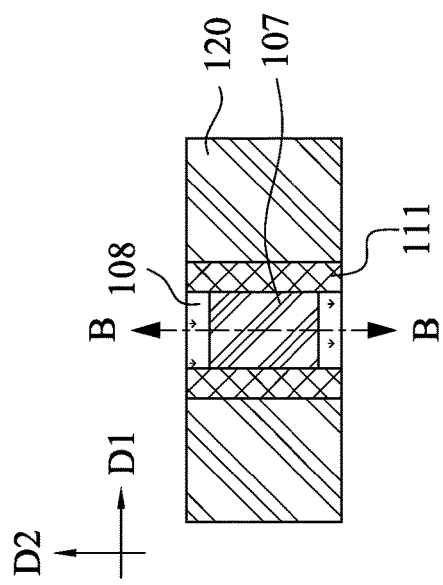
Figure 15B:
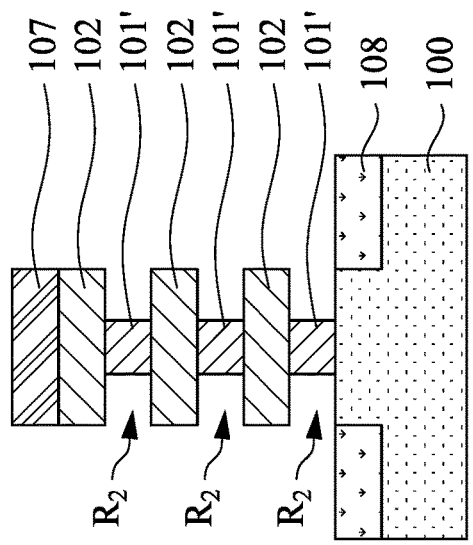

Reference is made to FIGS. 15A and 15B, in which FIG. 15A is a top view of one stage of manufacturing a semiconductor device, and FIG. 15B is a cross-sectional view along line B-B of FIG. 15A. The mask 107 (shown in FIGS. 14A and 14B) is removed. In some embodiments, the mask 107 may be removed by suitable process, such as wet etching using HF as etchants. In some embodiments, the isolation structure 108 may be partially removed during the removal of the mask 107.

Figure 16C:
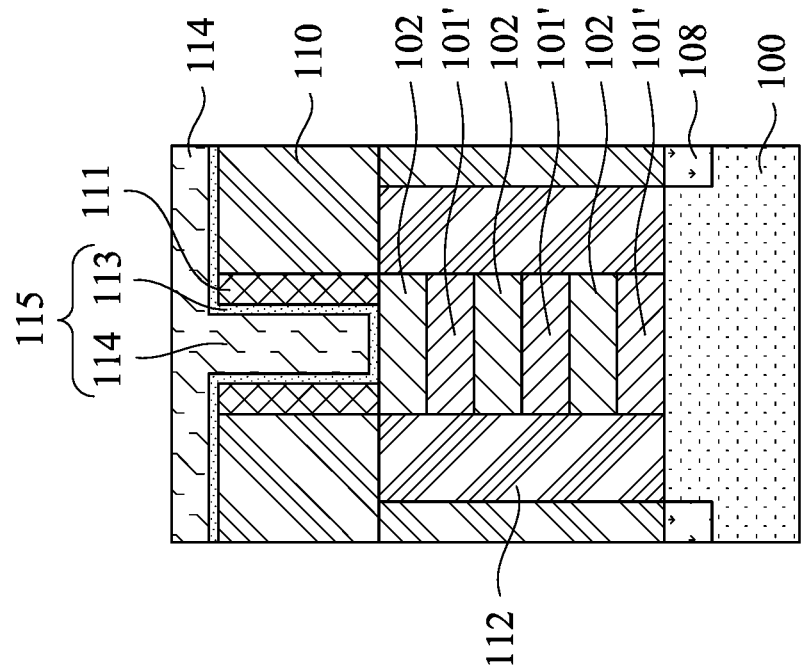
Figure 16A:
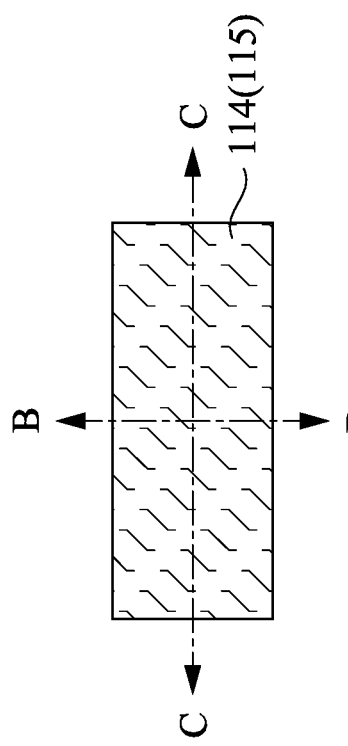
Figure 16B:
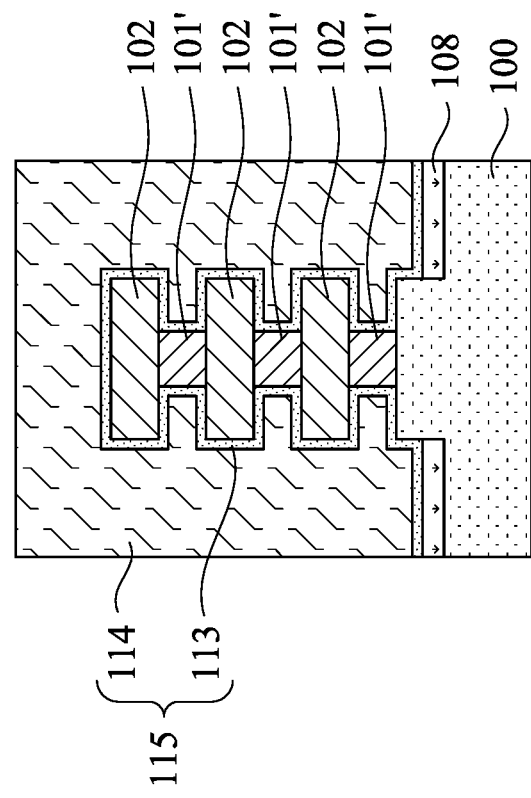

Reference is made to FIGS. 16A to 16C, in which FIG. 16A is a top view of one stage of manufacturing a semiconductor device, FIG. 16B is a cross-sectional view along line B-B of FIG. 16A, and FIG. 16C is a cross-sectional view along line C-C of FIG. 16A. A gate structure 115 is formed crossing and in contact with the first semiconductor layers 101' and the second semiconductor layers 102. A portion of the gate structure 115 is formed into the recesses $R_2$ (shown in FIG. 15B) and in contact with the remained first semiconductor layers 101'.

The gate structure 115 includes a gate dielectric 113 conformally formed on exposed surfaces of the first semiconductor layers 101' and the second semiconductor layers 102 and a gate metal 114 formed over the gate dielectric 113. The gate dielectric 113, as used and described herein, includes dielectric materials having a high dielectric constant, for example, greater than that of thermal silicon oxide (~3.9). The gate metal 114 may include a metal, metal alloy, and/or metal silicide.

In some embodiments, the gate metal 114 included in the gate structure 115 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide. For example, the gate metal 114 formed may also include capping layer(s), work function metal layer(s), fill layer(s), and/or other suitable layers that are desirable in a metal gate structure. A work function metal layer included in the gate metal 114 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electro-plating and/or other suitable process. In some embodiments, the capping layer included in the gate metal 114 may include refractory metals and their nitrides (e.g. TiN, TaN, $W_2N$, TiSiN, TaSiN). The cap layer of the gate metal 114 may be deposited by PVD, CVD, metal-organic chemical vapor deposition (MOCVD) and ALD. In some embodiments, the fill layer included in the gate metal 114 may include tungsten (W). The metal layer may be deposited by ALD, PVD, CVD, or other suitable process.

In some embodiments, the gate dielectric 113 may include a dielectric material such as silicon oxide ($SiO_2$), HfSiO, and/or silicon oxynitride (SiON). The interfacial layer may be formed by chemical oxidation, thermal oxidation, ALD, CVD, and/or other suitable method. The gate dielectric 113 may include a high-K dielectric layer such as hafnium oxide ($HfO_2$). Alternatively, the gate dielectric 113 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric 113 may be formed by ALD, PVD, CVD, oxidation, and/or other suitable methods.

Figure 17A:
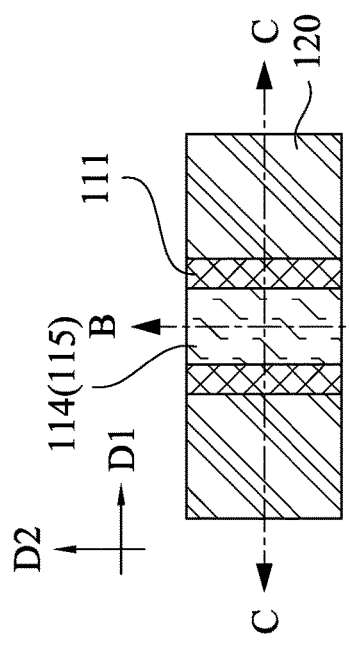
Figure 17B:
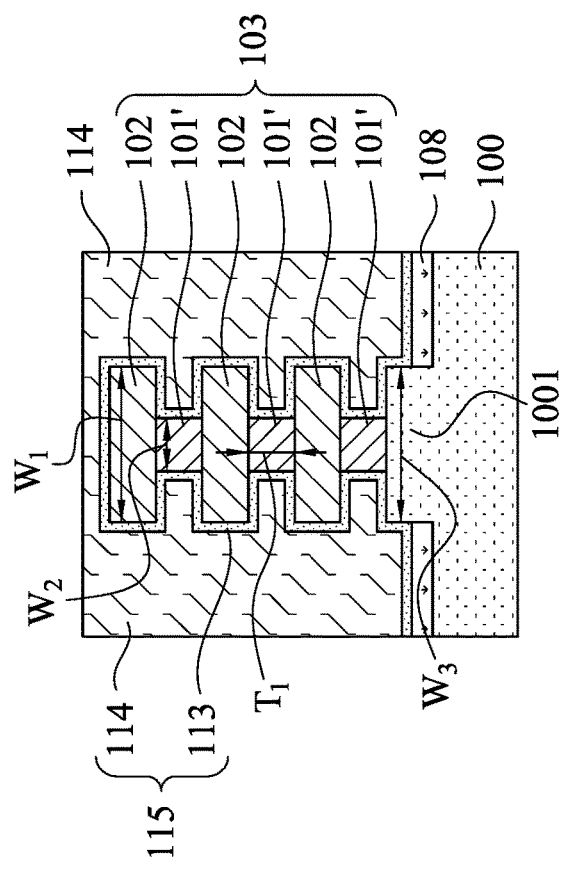
Figure 17C:
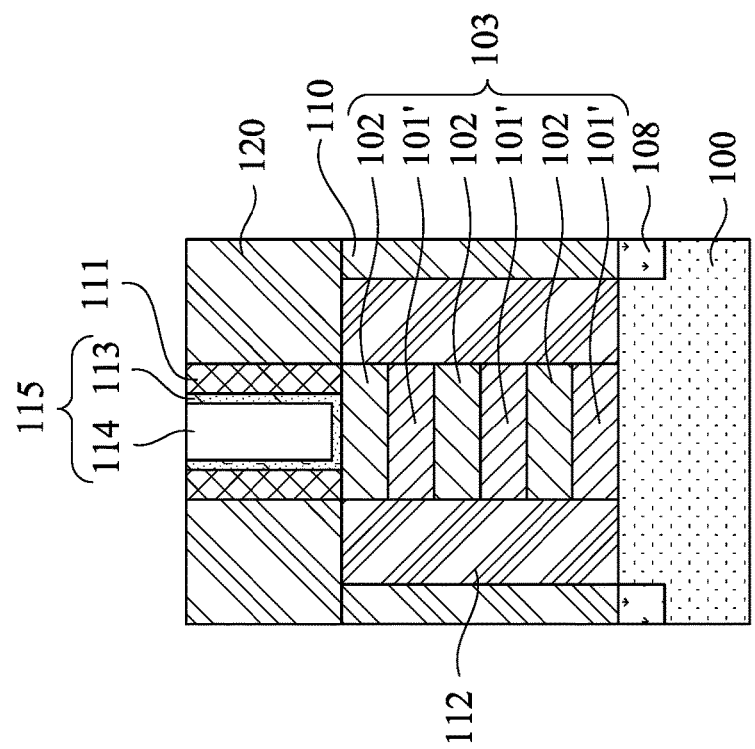

Reference is made to FIGS. 17A to 17C, in which FIG. 17A is a top view of one stage of manufacturing a semiconductor device, FIG. 17B is a cross-sectional view along line B-B of FIG. 17A, and FIG. 17C is a cross-sectional view along line C-C of FIG. 17A. A planarization process, such as CMP, is performed to the gate structure 115 until the isolation material 120 is exposed.

The first semiconductor layers 101' and the second semiconductor layers 102 may be collectively referred to as a channel structure 103. Further, the first semiconductor layers 101' and the second semiconductor layers 102 may be referred to as the first portions 101' and the second portions 102 of the channel structure 103, in which the first portions 101' and the second portions 102 are made from different materials. The width $W_1$ of the first portions 101' is smaller than width $W_2$ of the second portions 102 along the direction D1, and the width $W_3$ of the protrusion portion 1001 of the substrate 100 is substantially equal to the width $W_2$ of the second portions 102 along the direction D1. The gate structure 115 crosses the channel structure 103 along the direction D2. In some embodiments, the first portions 101' have a thickness $T_1$, in which the thickness $T_1$ is larger than the width $W_1$.

FIGS. 18A to 36C illustrate a method of manufacturing a semiconductor device at various stages in accordance with some embodiments. Some relevant structural and manufacturing details of the semiconductor device of FIGS. 18A to 36C are similar to the semiconductor device of FIGS. 1A to 14C, and, therefore, similar descriptions in this regard will not be repeated hereinafter.

Reference is made to FIGS. 18A and 18B, in which FIG. 18A is a top view of one stage of manufacturing a semiconductor device, and FIG. 18B is a cross-sectional view along line B-B of FIG. 18A. A substrate 200 is provided. The structure and material of the substrate 200 may be the same as or similar to the substrate 100 of FIGS. 1A and 1B.

Reference is made to FIGS. 19A and 19B, in which FIG. 19A is a top view of one stage of manufacturing a semiconductor device, and FIG. 19B is a cross-sectional view along line B-B of FIG. 19A. A plurality of first semiconductor layers 201 and second semiconductor layers 202 are formed over the substrate 200, in which the first semiconductor layers 201 and second semiconductor layers 202 are alternately formed such that the first semiconductor layers 201 and second semiconductor layers 202 are alternately stacked on each other. The structure and material of the first semiconductor layers 201 and the second semiconductor layers 202 may respectively be the same as or similar to the first semiconductor layers 101 and second semiconductor layers 102 of FIGS. 2A and 2B.

Reference is made to FIGS. 20A and 20B, in which FIG. 20A is a top view of one stage of manufacturing a semiconductor device, and FIG. 20B is a cross-sectional view along line B-B of FIG. 20A. A patterned mask 207 is formed over the first semiconductor layers 201 and the second semiconductor layers 202 to define a fin region in the following process. The structure and material of the patterned mask 207 may be the same as or similar to the patterned mask 107 of FIGS. 3A and 3B.

Figure 21A:
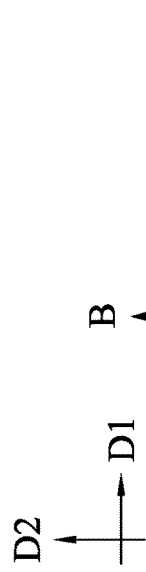
Figure 21B:
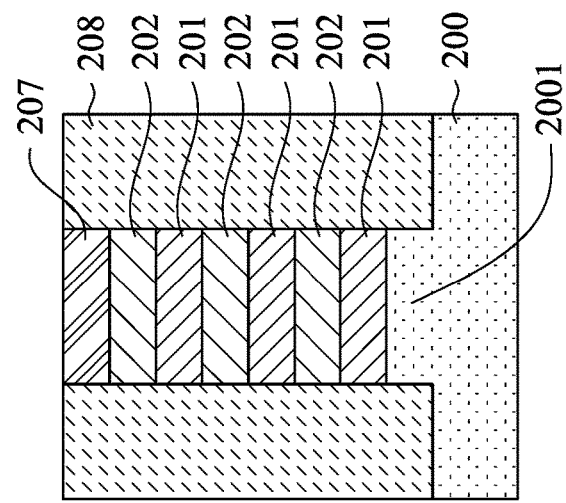

Reference is made to FIGS. 21A and 21B, in which FIG. 21A is a top view of one stage of manufacturing a semiconductor device, and FIG. 21B is a cross-sectional view along line B-B of FIG. 21A. The substrate 200, the first semiconductor layers 201, and the second semiconductor layers 202 are patterned with the mask 207. The patterned first semiconductor layers 201 and the patterned second semiconductor layers 202 extend along a direction D1.

Figure 22A:
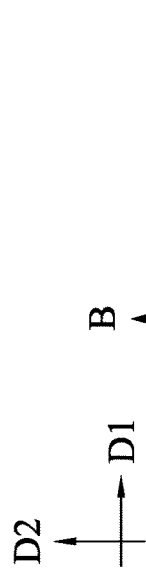
Figure 22B:
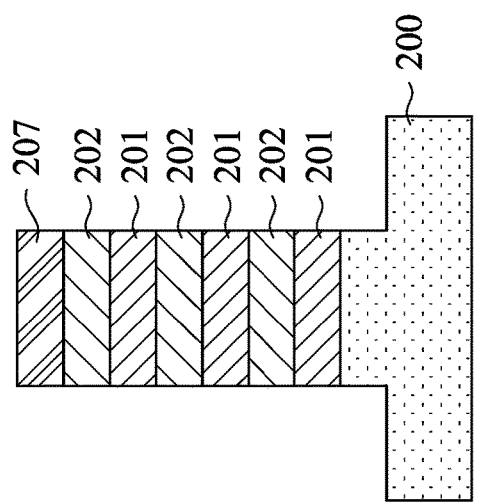

Reference is made to FIGS. 22A and 22B, in which FIG. 22A is a top view of one stage of manufacturing a semiconductor device, and FIG. 22B is a cross-sectional view along line B-B of FIG. 22A. An isolation structure 208 is formed over the substrate 200 and adjacent to the protrusion portion 2001 of the substrate 200. The isolation structure 208 may be formed by depositing a dielectric material over the substrate and following with a planarization process until the mask 207 is exposed. In some embodiments, the isolation structure 208 is in contact with the first semiconductor layers 201, the second semiconductor layers 202, and the mask 207. The material of the isolation structure 208 may be the same as or similar to the isolation structure 108 of FIGS. 5A and 5B.

Reference is made to FIGS. 23A and 23B, in which FIG. 23A is a top view of one stage of manufacturing a semiconductor device, and FIG. 23B is a cross-sectional view along line B-B of FIG. 23A. The mask 207 is patterned to form an opening $O_1$. The opening $O_1$ exposes a middle portion of the second semiconductor layers 202 along the direction D1.

Reference is made to FIGS. 24A and 24B, in which FIG. 24A is a top view of one stage of manufacturing a semiconductor device, and FIG. 24B is a cross-sectional view along line B-B of FIG. 24A. The first semiconductor layers 201 and the second semiconductor layers 202 are patterned using the mask 207. In some embodiments, the first semiconductor layers 201 and the second semiconductor layers 202 may be patterned by suitable process, such as etching. For example, an anisotropic etching using $Cl_2$ as etchant may be employed. During the etching process, a recess $R_3$ is formed in the first semiconductor layers 201 and the second semiconductor layers 202. The remained first semiconductor layers 201 and second semiconductor layers 202 are labeled as 201' and 202', respectively. In some embodiments, the recess $R_3$ extends into the substrate 200.

Figure 25A:
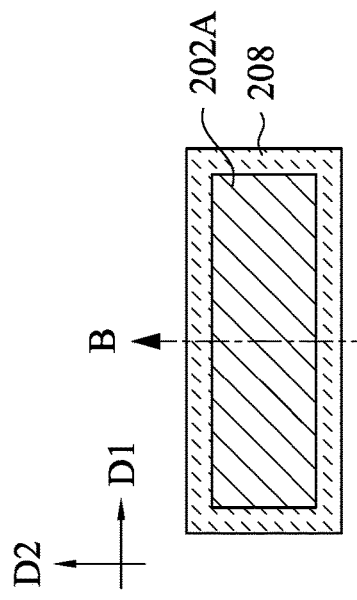
Figure 25B:
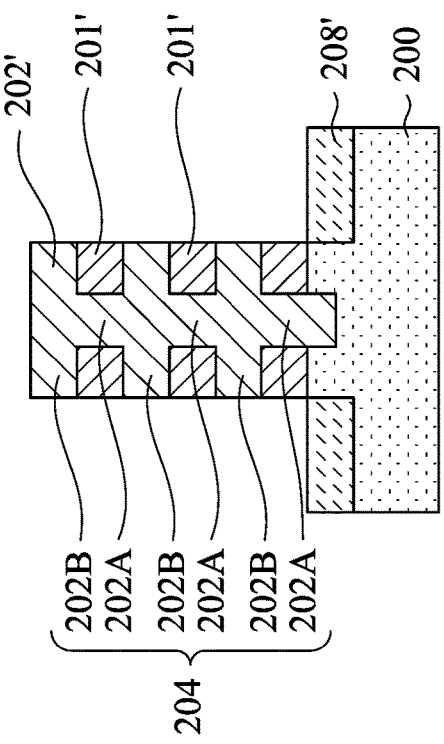

Reference is made to FIGS. 25A and 25B, in which FIG. 25A is a top view of one stage of manufacturing a semiconductor device, and FIG. 25B is a cross-sectional view along line B-B of FIG. 25A. A semiconductor material 203 is formed over the substrate 200 and into the recess $R_3$ (shown in FIGS. 24A and 24B). Then, a planarization process, such as CMP, may be performed to remove the excessive semiconductor material 203 until the topmost second semiconductor layer 202' is exposed. The material of the semiconductor material 203 and the material of the second semiconductor layer 202' are the same. Accordingly, the semiconductor material 203 and the second semiconductor layer 202' may be collectively referred to as a channel structure 204 in the following descriptions. From other perspectives, the channel structure 204 includes a plurality of first portions 202A and a plurality of second portions 202B made from the same material, in which the width $W_4$ of the first portions 202A is smaller than the width $W_5$ of the second portions 202B. In some embodiments, the bottommost first portion 202A extends into the substrate 200.

Figure 26A:
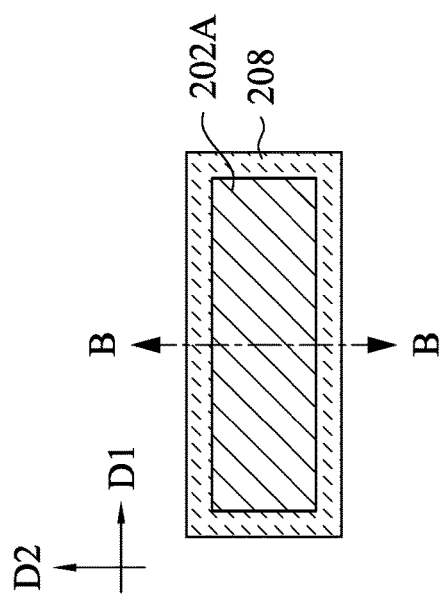
Figure 26B:
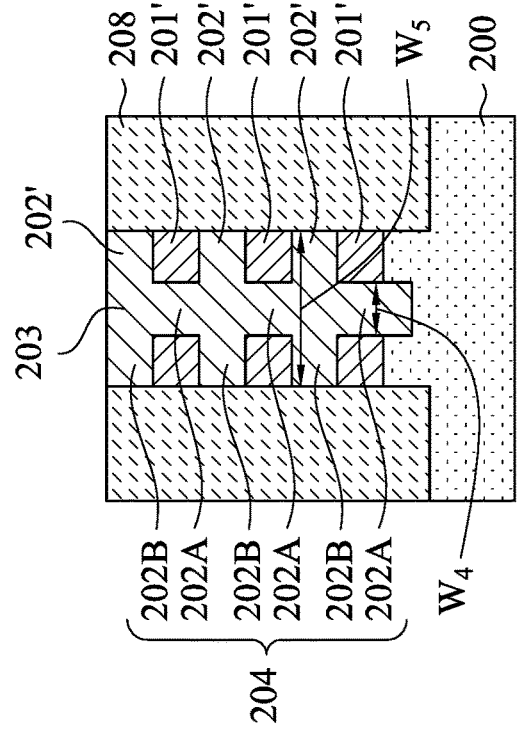

Reference is made to FIGS. 26A and 26B, in which FIG. 26A is a top view of one stage of manufacturing a semiconductor device, and FIG. 26B is a cross-sectional view along line B-B of FIG. 26A. The isolation structure 208 is partially removed to expose the first semiconductor layers 201' and the channel structure 204. The isolation structure 208 may be removed by suitable process, such as etching by using HF as etchants. The remained isolation structure 208 is labeled 208' in the following descriptions.

Figure 27A:
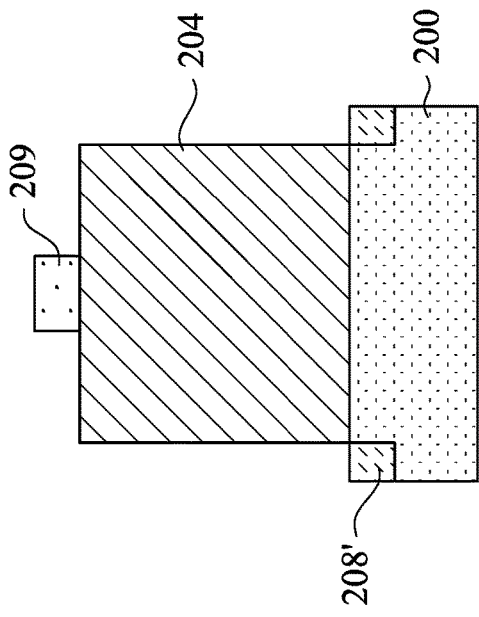
Figure 27C:
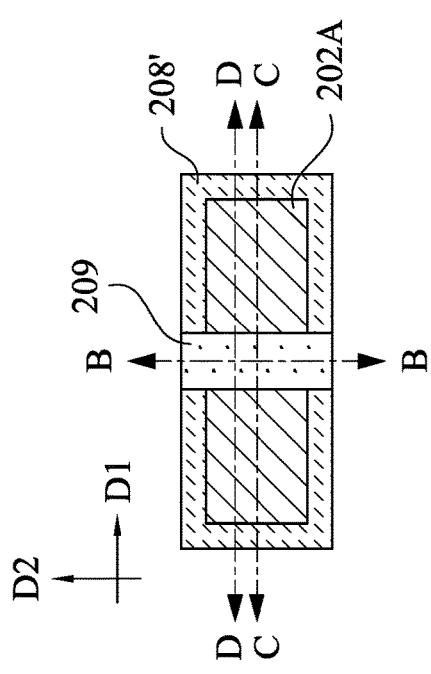
Figure 27B:
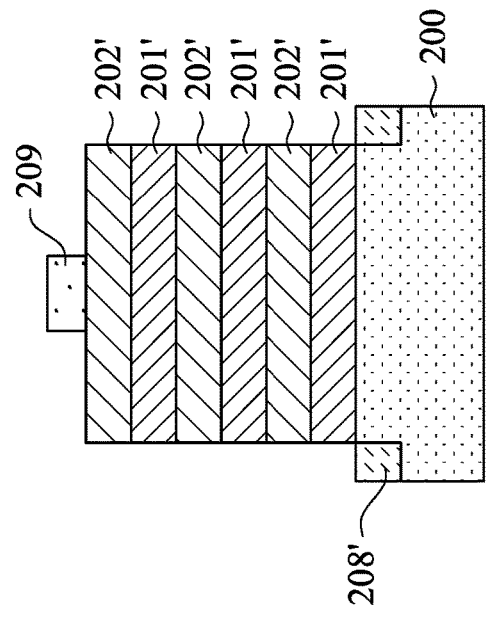
Figure 27D:
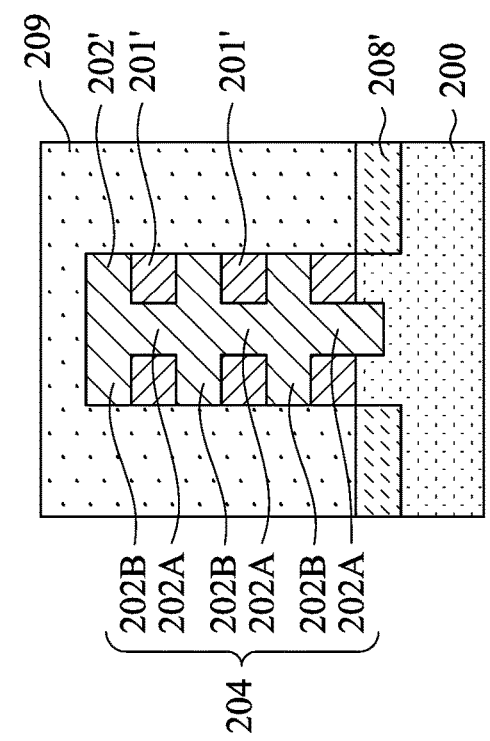

Reference is made to FIGS. 27A to 27D, in which FIG. 27A is a top view of one stage of manufacturing a semiconductor device, FIG. 27B is a cross-sectional view along line B-B of FIG. 27A, FIG. 27C is a cross-sectional view along line C-C of FIG. 27A, and FIG. 27D is a cross-sectional view along line D-D of FIG. 27A. A dummy gate structure 209 is formed over the substrate 200 and crossing the channel structure 204 along the direction D2, in which the direction D2 is different from the direction D1. For example, the direction D2 is substantially vertical to the direction D1. The structure and material of the dummy gate structure 209 may be the same as or similar to the dummy gate structure 109 of FIGS. 6A and 6B.

Figure 28A:
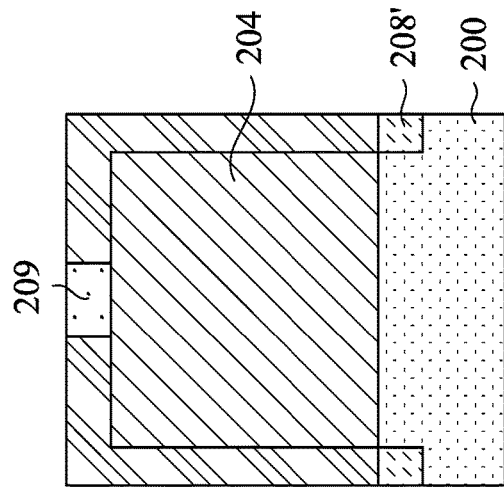
Figure 28C:
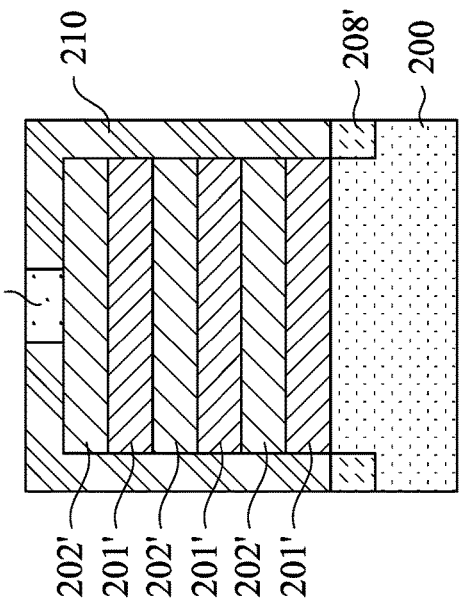
Figure 28B:
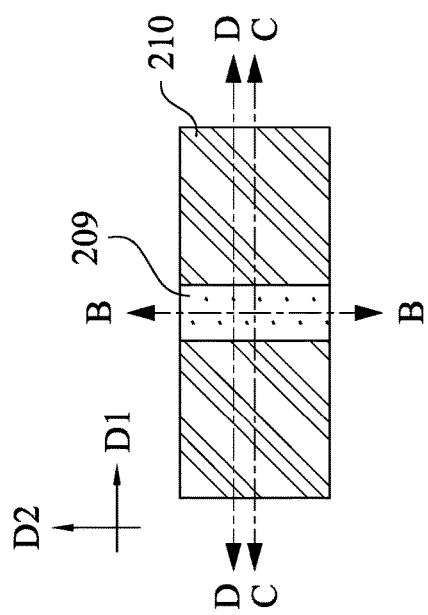
Figure 28D:
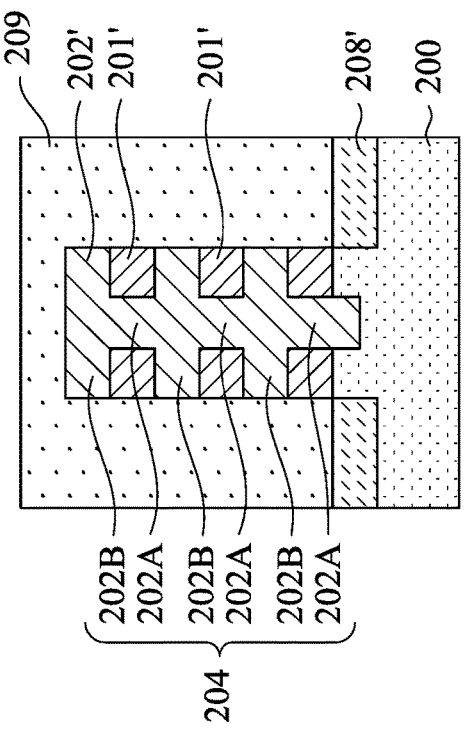

Reference is made to FIGS. 28A to 28D, in which FIG. 28A is a top view of one stage of manufacturing a semiconductor device, FIG. 28B is a cross-sectional view along line B-B of FIG. 28A, FIG. 28C is a cross-sectional view along line C-C of FIG. 28A, and FIG. 28D is a cross-sectional view along line D-D of FIG. 28A. An isolation material 210 is formed over the substrate 200. Further, a planarization process, such as chemical mechanical polishing (CVD), may be performed to the isolation material 210 until the dummy gate structure 209 is exposed, such that top surfaces of the isolation material 210 and the dummy gate structure 209 are substantially coplanar. The structure material of the isolation material 210 may be the same as or similar to the isolation material 110 of FIGS. 7A and 7B.

Figure 29C:
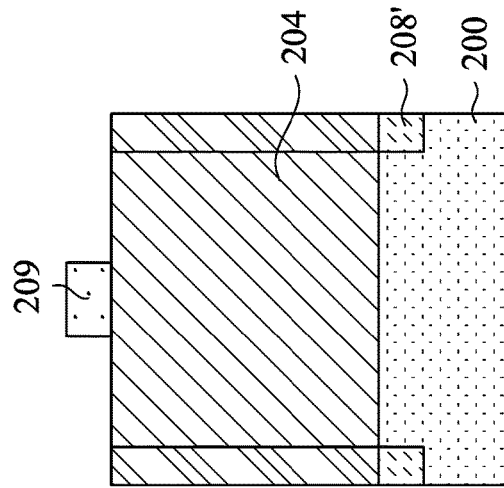
Figure 29D:
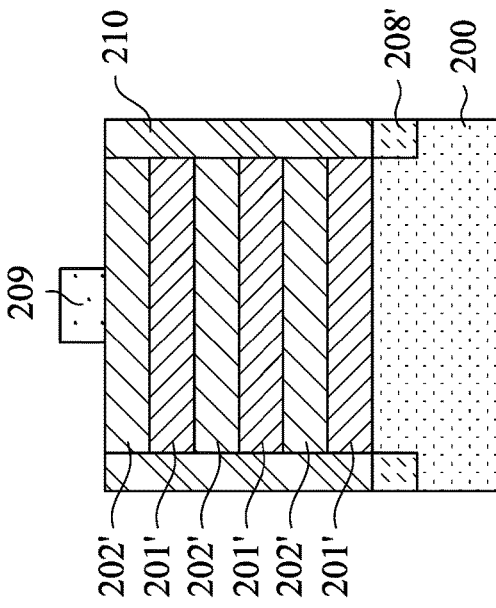
Figure 29A:
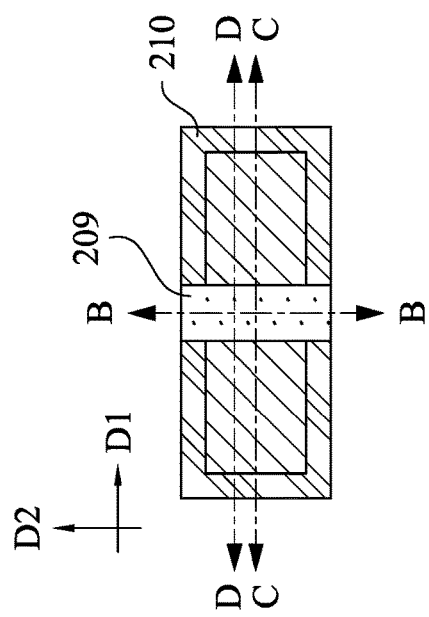
Figure 29B:
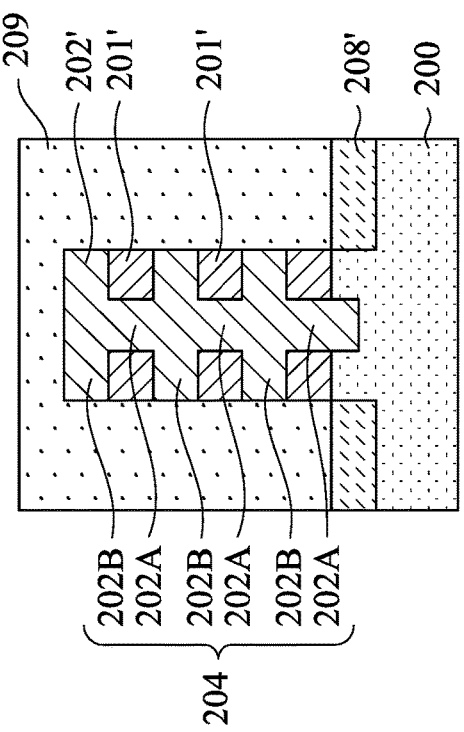

Reference is made to FIGS. 29A to 29D, in which FIG. 29A is a top view of one stage of manufacturing a semiconductor device, FIG. 29B is a cross-sectional view along line B-B of FIG. 29A, FIG. 29C is a cross-sectional view along line C-C of FIG. 29A, and FIG. 29D is a cross-sectional view along line D-D of FIG. 29A. The isolation material 210 is partially removed by, for example, dry etching. Accordingly, the topmost second portion 202B of the channel structure 204 is exposed from the isolation material 210.

Figure 30A:
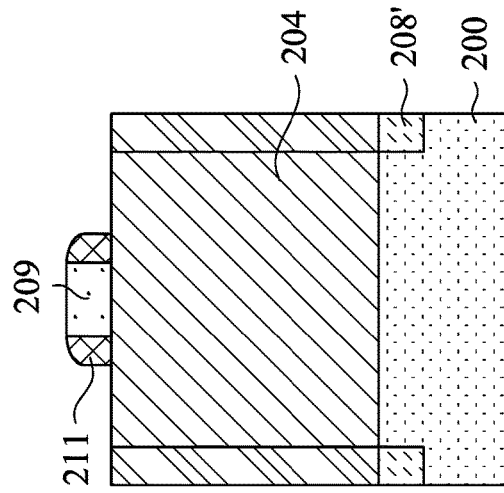
Figure 30C:
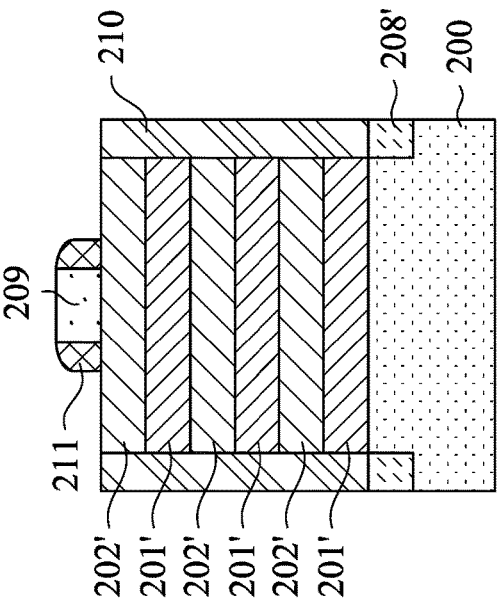
Figure 30B:
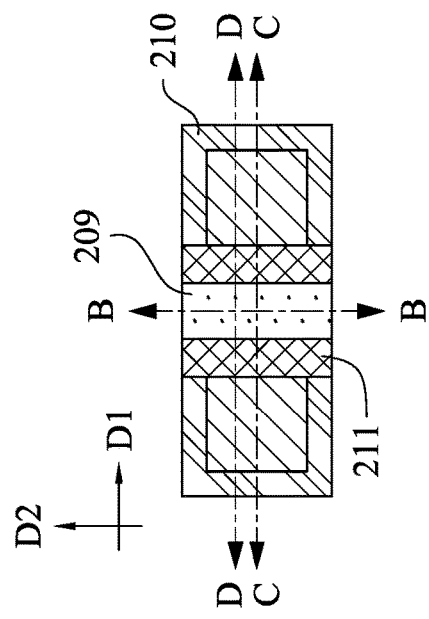
Figure 30D:
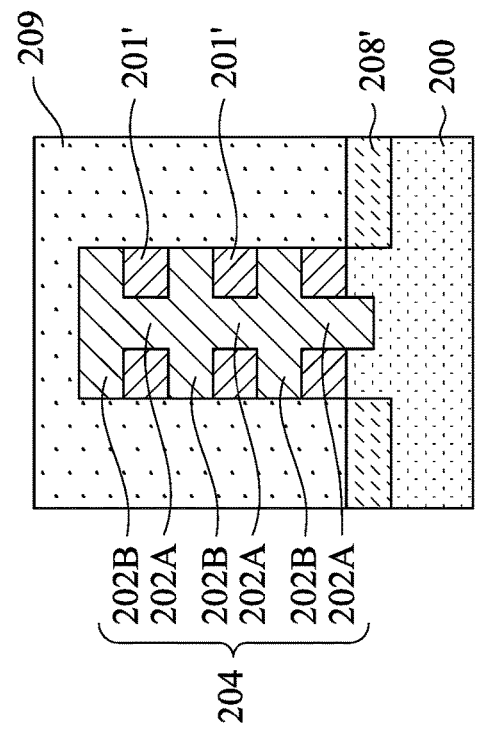

Reference is made to FIGS. 30A to 30D, in which FIG. 30A is a top view of one stage of manufacturing a semiconductor device, FIG. 30B is a cross-sectional view along line B-B of FIG. 30A, FIG. 30C is a cross-sectional view along line C-C of FIG. 30A, and FIG. 30D is a cross-sectional view along line D-D of FIG. 30A. Plural gate spacers 211 are formed on opposite sidewalls of the dummy gate structure 209. The structure and material of the gate spacers 211 may be the same as or similar to the gate spacers 111 of FIGS. 10A and 10C.

Figure 31A:
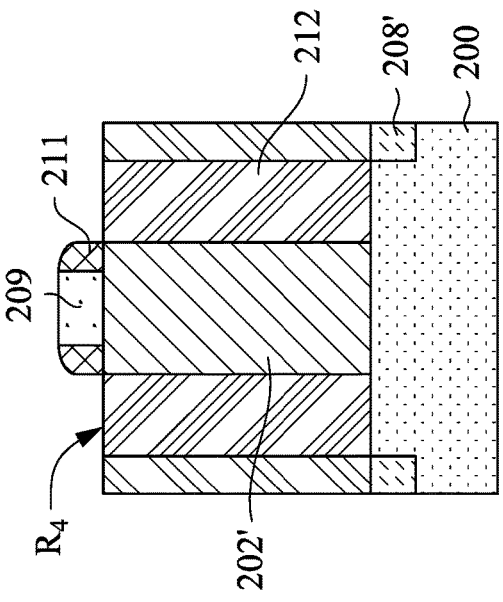
Figure 31C:
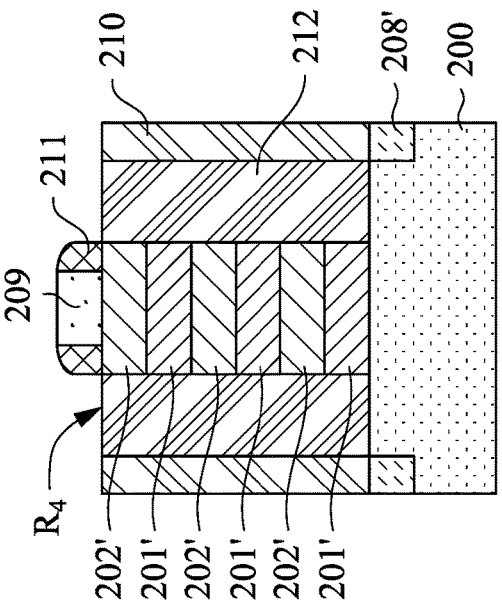
Figure 31B:
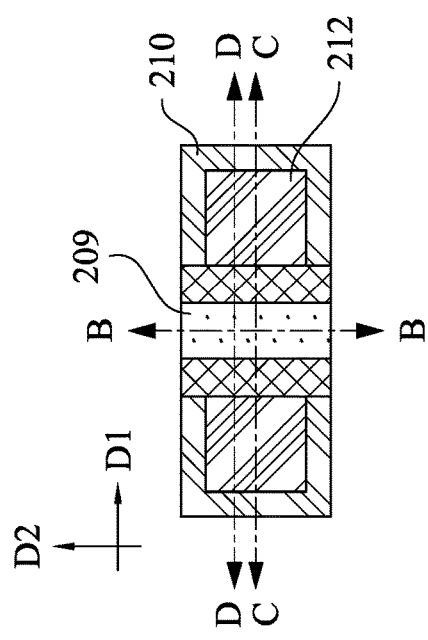
Figure 31D:
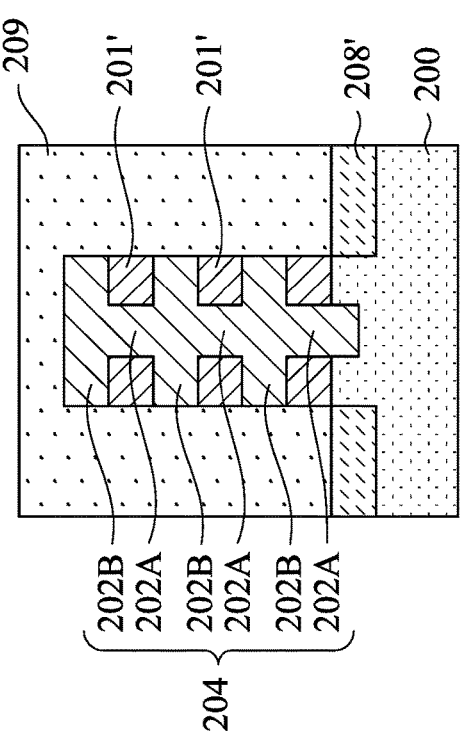

Reference is made to FIGS. 31A to 31D, in which FIG. 31A is a top view of one stage of manufacturing a semiconductor device, FIG. 31B is a cross-sectional view along line B-B of FIG. 31A, FIG. 31C is a cross-sectional view along line C-C of FIG. 31A, and FIG. 31D is a cross-sectional view along line D-D of FIG. 31A. The first semiconductor layers 201' and the second semiconductor layers 202' are patterned using the dummy gate structure 209 and the gate spacers 211 as a mask. After the patterning, recesses $R_4$ are formed over the substrate 200, in which one of the recesses R2 is defined by the isolation material 210 and the semiconductor layers 201' and 202'. Then, source/drain structures 212 are formed in the recesses $R_4$, respectively. Accordingly, the source/drain structures 212 are in contact with the isolation material 210, and the semiconductor layers 201' and 202'. The structure and material of the source/drain structures 212 may be the same as or similar to the source/drain structures 112 of FIGS. 11A and 11C.

Figure 32A:
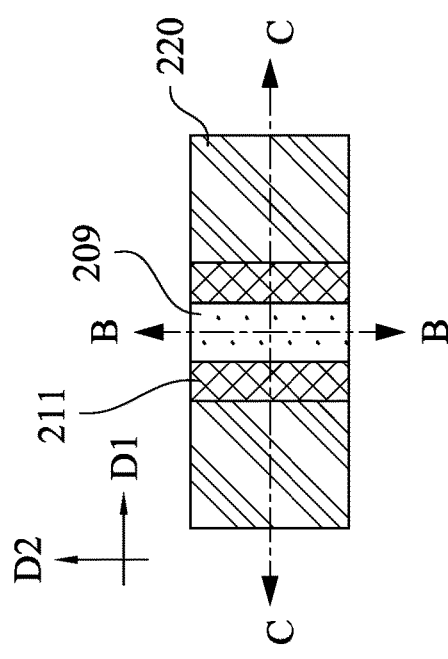
Figure 32C:
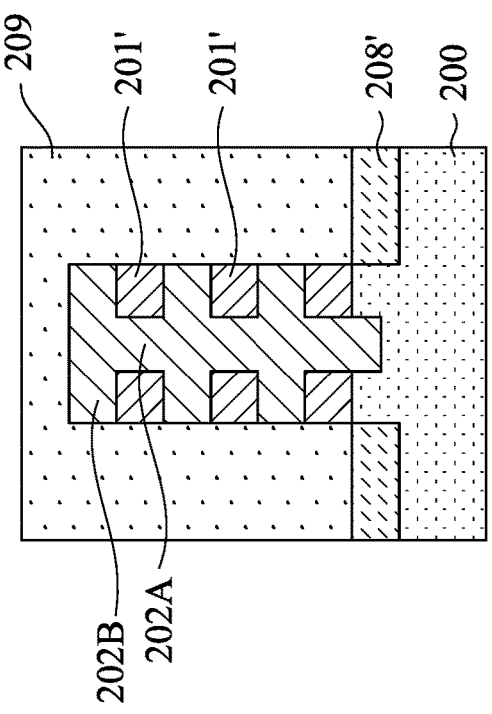
Figure 32B:
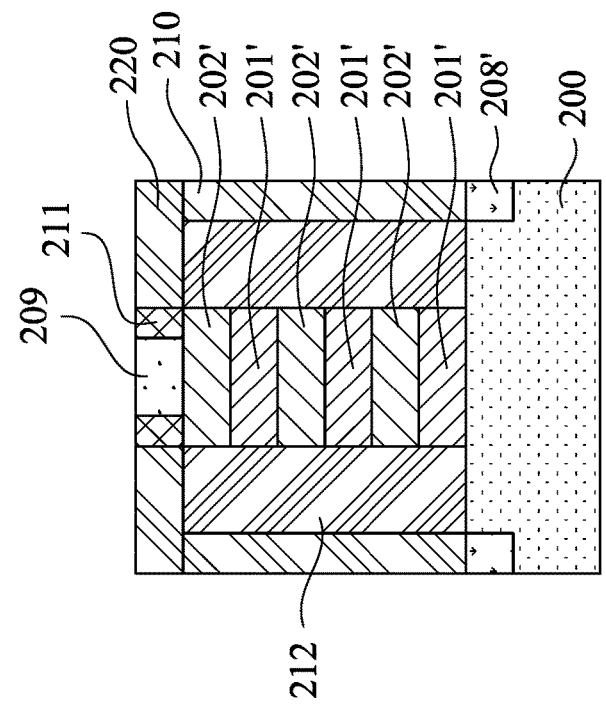

Reference is made to FIGS. 32A to 32C, in which FIG. 32A is a top view of one stage of manufacturing a semiconductor device, FIG. 32B is a cross-sectional view along line B-B of FIG. 32A, and FIG. 32C is a cross-sectional view along line C-C of FIG. 32A. An isolation material 220 is formed over the substrate 200. In some embodiments, the material of the isolation material 220 is the same as the isolation material 210. Further, a planarization process, such as chemical mechanical polishing (CVD), may be performed to the isolation material 220 until the dummy gate structure 209 is exposed, such that top surfaces of the isolation material 220, the dummy gate structure 209, and the gate spacers 211 are substantially coplanar. The structure and material of the isolation material 220 may be the same as or similar to the isolation material 120 of FIGS. 12A and 12C.

Figure 33A:
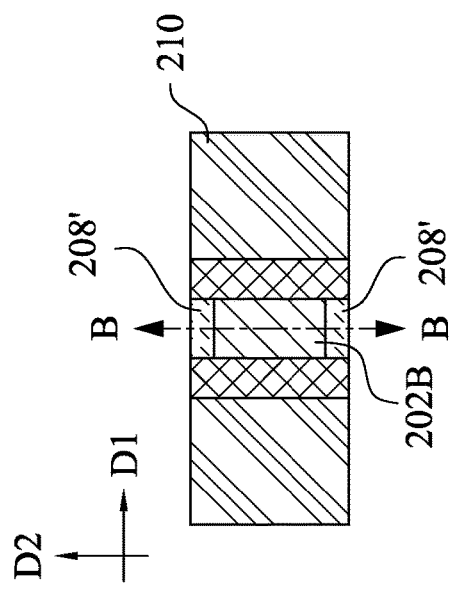
Figure 33B:
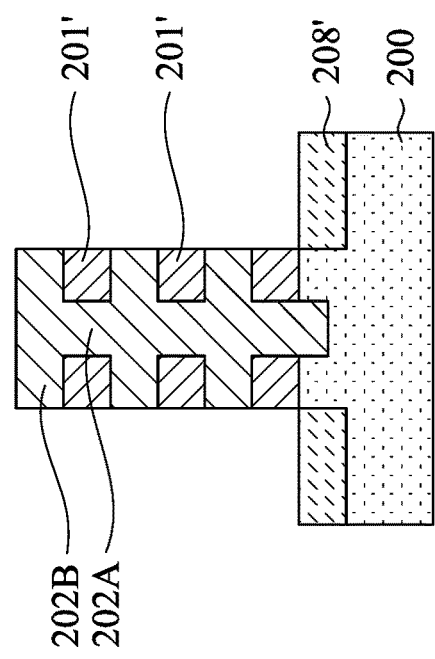

Reference is made to FIGS. 33A to 33B, in which FIG. 33A is a top view of one stage of manufacturing a semiconductor device, FIG. 33B is a cross-sectional view along line B-B of FIG. 33A. The dummy gate structure 209 is removed. In some embodiments, a replacement gate (RPG) process scheme is employed. In a RPG process scheme, a dummy polysilicon gate (the dummy gate electrode in this case) is formed first and is replaced later by a metal gate after high thermal budget processes are performed. In some embodiments, the dummy gate electrode is removed to form an opening with the spacers 211 as its sidewall. In some other embodiments, the gate dielectric is removed as well. Alternatively, in some embodiments, the dummy gate electrode is removed while the gate dielectric retains. The dummy gate electrode (and the gate dielectric) may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 34A:
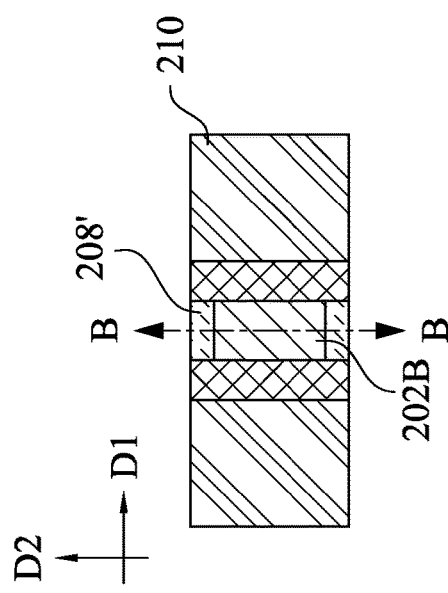
Figure 34B:
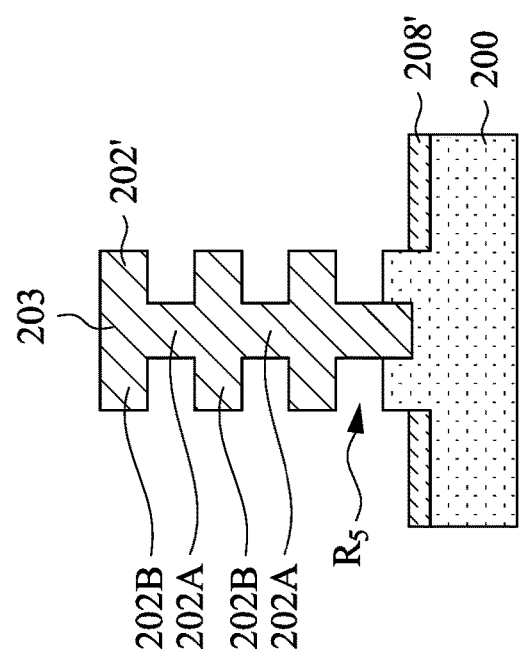

Reference is made to FIGS. 34A to 34B, in which FIG. 34A is a top view of one stage of manufacturing a semiconductor device, FIG. 34B is a cross-sectional view along line B-B of FIG. 34A. The first semiconductor layers 201' (shown in FIG. 33B) are removed by suitable process, such as isotropic etching by using $CF_4$ as etchant. In some embodiments, the etching process may include etching selectivity, such that the second semiconductor layers 202' and the semiconductor material 203 remain the same during the etching process. After the etching process, plural recesses $R_5$ are formed between two adjacent second portions 202B, in which the bottommost recess $R_5$ is between one second portions 202B and the substrate 200. From other perspectives, some of the recesses $R_5$ are defined by two second portions 202B and the first portion 202A therebetween. In some embodiments, the isolation structure 208' may be partially removed during the etching process.

Figure 35A:
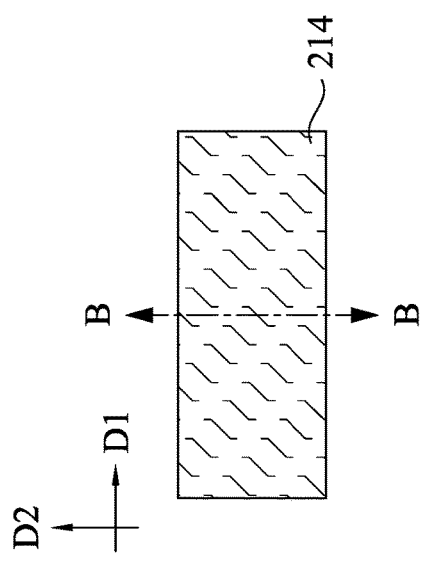
Figure 35B:
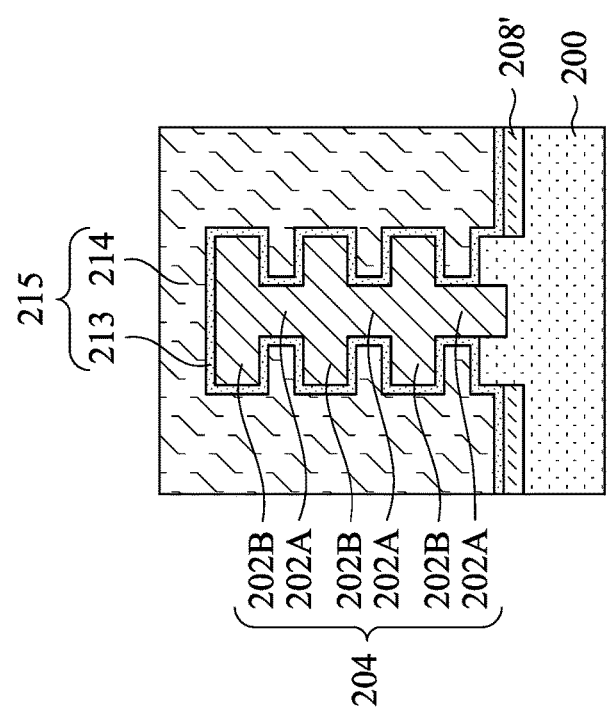

Reference is made to FIGS. 35A to 35B, in which FIG. 35A is a top view of one stage of manufacturing a semiconductor device, and FIG. 35B is a cross-sectional view along line B-B of FIG. 35A. A gate structure 215 is formed crossing and in contact with the channel structure 204 (the remained portion of second semiconductor layers 202' and the semiconductor material 203). A portion of the gate structure 215 is formed into the recesses $R_5$ (shown in FIG. 34B). In some embodiments, the gate structure 215 includes a gate dielectric 213 conformally formed on exposed surfaces of the channel structure 204, and a gate metal 214 formed over the gate dielectric 213. The structure and material of the gate structure 215 may be the same as or similar to the gate structure 115 of FIGS. 16B and 16C.

Reference is made to FIGS. 36A to 36B, in which FIG. 36A is a top view of one stage of manufacturing a semiconductor device, FIG. 36B is a cross-sectional view along line B-B of FIG. 36A, and FIG. 36C is a cross-sectional view along line C-C of FIG. 36A. A planarization process, such as CMP, is performed to the gate structure 215 until the isolation material 220 is exposed, such that the top surface of the gate structure 215 is level with that of the isolation material 220.

FIGS. 37A to 37C illustrate a method of manufacturing a semiconductor device at various stages in accordance with some embodiments.

Reference is made to FIG. 37A. The cross-sectional position of FIG. 37A is similar to the cross-sectional position of FIG. 2B, and thus other relevant structural and manufacturing details will not be repeated hereinafter. A plurality of first semiconductor layers 301 and second semiconductor layers 302 are formed over the substrate 300, in which the first semiconductor layers 301 and second semiconductor layers 302 are alternately formed such that the first semiconductor layers 301 and second semiconductor layers 302 are alternately stacked on each other. In some embodiments, the bottommost first semiconductor layer 301 has a thickness $T_2$, and other first semiconductor layers 301 have thickness $T_3$, in that thickness $T_2$ is larger than thickness $T_3$. The structure and material of the first semiconductor layers 301 and second semiconductor layers 302 may be the same as or similar to the first semiconductor layers 101 and second semiconductor layers 102 of FIGS. 2A and 2B.

Reference is made to FIG. 37B. The cross-sectional position of FIG. 37B is similar to the cross-sectional position of FIG. 15B, and thus other relevant structural and manufacturing details will not be repeated hereinafter. The first semiconductor layers 301 are partially removed by suitable process, such as isotropic etching by using $CF_4$ as etchant. In some embodiments, due to the etching properties, the bottommost layer of the first semiconductor layers 301 (shown in FIG. 37A) having larger thickness $T_2$ may have an etching rate faster than an etching rate of other first semiconductor layers 301 having thickness $T_3$ during the etching process. As a result, the bottommost layer of the first semiconductor layers 301 is consumed after the etching process. The remained first semiconductor layers 301 and the second semiconductor layers 302 may be collectively referred to as a channel structure 303. Further, the first semiconductor layers 301 may be referred to as first portions 301 of the channel structure 303, and the second semiconductor layers 302 may be referred to as second portions 302 of the channel structure 303, respectively. The channel structure 303 is spaced from the substrate 300, and one of the second portions 302 is the bottommost layer of the channel structure 303.

Reference is made to FIG. 37C. The cross-sectional position of FIG. 37C is similar to the cross-sectional position of FIG. 17B, and thus other relevant structural and manufacturing details will not be repeated hereinafter. Since the channel structure 303 is spaced from the substrate 300, the gate structure 315 is formed between the channel structure 303 and the substrate 300. Further, the gate structure 315 substantially covers the bottom surface of the channel structure 303. The structure and material of the gate structure 315 may be the same as or similar to the gate structure 115 of FIGS. 16B and 16C.

FIGS. 38A to 38C illustrate a method of manufacturing a semiconductor device at various stages in accordance with some embodiments.

Reference is made to FIG. 38A. The cross-sectional position of FIG. 38A is similar to the cross-sectional position of FIG. 37A, and thus other relevant structural and manufacturing details will not be repeated hereinafter. The first semiconductor layers 401 and the second semiconductor layers 402 are alternately stacked. The bottommost layer of the first semiconductor layers 401 has greater thickness than other first semiconductor layers 401. Due to the lattice mismatch between the bottommost first semiconductor layer 401 and the substrate 400, a portion of the bottommost first semiconductor layer 401 close to the substrate 400 may include more defects. On the other hands, other portions of the bottommost first semiconductor layers 401 away from the substrate 400 may have less defects due to strain relaxation. That is, the defects of the bottommost first semiconductor layers 401 decrease from the substrate 400 toward the second semiconductor layer 402. The structure and material of the first semiconductor layers 401 and second semiconductor layers 402 may be the same as or similar to the first semiconductor layers 401 and second semiconductor layers 402 of FIGS. 2A and 2B.

Reference is made to FIG. 38B. The cross-sectional position of FIG. 38B is similar to the cross-sectional position of FIG. 37B, and thus other relevant structural and manufacturing details will not be repeated hereinafter. Due to the etching property, the portion of the bottommost first semiconductor layer 401 having more defects may have a faster etching rate. As a result, in some embodiments, the portion of the of the bottommost first semiconductor layers 401 away from the substrate 400 having less defects may remain after the etching process. In some embodiments, the bottommost layer of first semiconductor layers 401 tapers from the second semiconductor layers 402 toward the substrate 400.

Reference is made to FIG. 38C. The cross-sectional position of FIG. 38C is similar to the cross-sectional position of FIG. 37C, and thus other relevant structural and manufacturing details will not be repeated hereinafter. Since the channel structure 403 is spaced from the substrate 300, the gate structure 315 is formed between the channel structure 403 and the substrate 400. Further, the gate structure 415 substantially covers the bottom surface of the channel structure 403. The structure and material of the gate structure 415 may be the same as or similar to the gate structure 115 of FIGS. 16B and 16C.

According to the aforementioned embodiments, a channel structure having a plurality of first portions and second portions is provided. The first portions have a width smaller than that of the second portions, and one of the first portions is disposed between and in contact with two adjacent second portions. The gate structure is formed crossing the channel structure and in contact with the first portions and the second portions. With such configuration, the channel structure may be formed with higher aspect ratio. As a result, the $I_{on}$ of the semiconductor device may be improved.

Some embodiments of the present disclosure is a semiconductor device including a substrate, a channel structure, and a gate structure. The channel structure is over the substrate and extends along a first direction, in which the channel structure has plurality of first portions and plurality of second portions alternately stacked, and a width of the first portions is smaller than that of the second portions in a second direction different from the first direction. The gate structure is disposed over the substrate and crossing the channel structure along the second direction, in which the gate structure is in contact with the first portions and the second portions.

Some embodiments of the present disclosure is a method for manufacturing a semiconductor device including forming a plurality of first semiconductor layers and a plurality of second semiconductor layers alternately stacked over a substrate; removing a portion of the first semiconductor layers to form at least one first recess between two adjacent second semiconductor layers; and forming a gate structure crossing the first semiconductor layers and first semiconductor layers, in which a portion of the gate structure is formed into the first recess and in contact with the remained portion of the first semiconductor layers.

Some embodiments of the present disclosure is a method for manufacturing a semiconductor device including forming a plurality of first semiconductor layers and a plurality of second semiconductor layers alternately stacked over a substrate; removing portions of the first semiconductor layers and the second semiconductor layers to form a first recess penetrating the first semiconductor layers and the second semiconductor layers; forming a semiconductor material into the first recess; removing the remained portion of the first semiconductor layers to form at least one second recess between two adjacent second semiconductor layers; forming a gate structure crossing the remained portion of the second semiconductor layers and the semiconductor material, in which a portion of the gate structure is formed into the second recess between two adjacent second semiconductor layers and in contact with the semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a channel structure over the substrate and extends along a first direction, wherein the channel structure comprises a plurality of first portions and plurality of second portions alternately stacked, and a width of the first portions is smaller than that of the second portions in a second direction different from the first direction;
a gate structure disposed over the substrate and crossing the channel structure along the second direction, wherein the gate structure is in contact with the first portions and the second portions; and a source/drain structure in direct contact with the first portions of the channel structure.

2. The semiconductor device of claim 1, wherein the first portions and the second portions are formed from different materials.

3. The semiconductor device of claim 1, wherein the substrate comprises a protrusion portion, the first and the second portions are over the protrusion portion, wherein along the second direction, a width of the protrusion portion is substantially equal to that of the second portions.

4. The semiconductor device of claim 3, wherein a bottommost layer of the first portions is in contact with the protrusion portion.

5. The semiconductor device of claim 1, wherein at least one of the second portions is in contact with two adjacent first portions.

6. The semiconductor device of claim 1, wherein one of the first portions is a bottommost layer of the channel structure.

7. A method for manufacturing a semiconductor device, comprising:

forming a plurality of first semiconductor layers and a plurality of second semiconductor layers alternately stacked over a substrate;

removing a portion of the first semiconductor layers to form at least one first recess between two adjacent second semiconductor layers; and forming a gate structure crossing the first semiconductor layers and first semiconductor layers, wherein a portion of the gate structure is formed into the first recess and in contact with the remained portion of the first semiconductor layers.

8. The method of claim 7, wherein the removing a portion of the first semiconductor layers comprises tuning an etching rate of the removing process to keep the remained portions of the first semiconductor layers are in contact with two adjacent second semiconductor layers.

9. The method of claim 7, further comprising forming a source/drain structure in contact with the first semiconductor layers and the second semiconductor layers before removing the portion of the first semiconductor layers.

10. The method of claim 7, further comprising increasing a dopant concentration of the first semiconductor layers.

11. The method of claim 9, further comprising forming an isolation material over the source/drain structure prior to removing the portion of the first semiconductor layers.

12. A semiconductor device, comprising:

a substrate;

a plurality of first semiconductor layers and a plurality of second semiconductor layers alternately arranged over the substrate; and a gate structure over the substrate and wrapping the first and second semiconductor layers, wherein first portions of the gate structure extend between two adjacent second semiconductor layers, and one of the first semiconductor layers is disposed between the first portions of the gate structure.

13. The semiconductor device of claim 12, wherein opposite sidewalls of the first semiconductor layers are in contact with the gate structure.

14. The semiconductor device of claim 12, wherein second portions of the gate structure extend between the substrate and a bottommost layer of the second semiconductor layers, and the second portions are disposed at opposite sides of a bottommost layer of the first semiconductor layers.

15. The semiconductor device of claim 14, wherein the substrate comprises a protrusion portion, and the second portions of the gate structure are in contact with the protrusion portion.

16. The semiconductor device of claim 12, wherein the gate structure comprises a gate dielectric in contact with the first semiconductor layers, the second semiconductor layers, and the substrate.

17. The semiconductor device of claim 16, wherein the gate structure further comprises a gate metal over the gate dielectric and extends between two adjacent second semiconductor layers.

18. The semiconductor device of claim 12, wherein the first semiconductor layers and the second semiconductor layers have etching selectivity.

19. The semiconductor device of claim 12, wherein the first semiconductor layers are narrower than the second semiconductor layers.

20. The semiconductor device of claim 1, wherein a portion of the gate structure extends between two adjacent second portions of the channel structure.

* * * * *